US010964752B2

(12) United States Patent
Takahashi et al.

(10) Patent No.: US 10,964,752 B2
(45) Date of Patent: Mar. 30, 2021

(54) THREE-DIMENSIONAL MEMORY DEVICE INCLUDING LATERALLY CONSTRICTED CURRENT PATHS AND METHODS OF MANUFACTURING THE SAME

(71) Applicant: WESTERN DIGITAL TECHNOLOGIES, INC., San Jose, CA (US)

(72) Inventors: Yuji Takahashi, San Jose, CA (US); Masatoshi Nishikawa, Nagoya (JP); Wei Kuo Shih, Cupertino, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 33 days.

(21) Appl. No.: 16/440,378

(22) Filed: Jun. 13, 2019

(65) Prior Publication Data

US 2020/0395408 A1 Dec. 17, 2020

(51) Int. Cl.
  *H01L 27/24* (2006.01)
  *H01L 45/00* (2006.01)
(52) U.S. Cl.
  CPC ........ *H01L 27/249* (2013.01); *H01L 45/1683* (2013.01); *H01L 45/06* (2013.01); *H01L 45/1226* (2013.01)
(58) Field of Classification Search
  CPC .............................. H01L 27/249; H01L 45/06
  See application file for complete search history.

(56) References Cited

U.S. PATENT DOCUMENTS 9,230,974 B1 1/2016 Pachamuthu et al.
9,252,151 B2 2/2016 Chien et al.
(Continued)

FOREIGN PATENT DOCUMENTS

KR 1020110072025 A 6/2011
KR 1020180068527 A 6/2018

OTHER PUBLICATIONS

A. Pirovano et al., "Scaling Analysis of Phase-Change Memory Technology", IEDM Technical Digest, 29.6.1 (2003) 4 pages.
(Continued)

*Primary Examiner* — Eugene Lee
(74) *Attorney, Agent, or Firm* — The Marbury Law Group PLLC

(57) ABSTRACT

A vertically alternating sequence of insulating layers and sacrificial material layers is formed over a substrate. Line trenches extending along a first horizontal direction are formed through the vertically alternating sequence. The vertically alternating sequence is divided into vertically alternating stacks of insulating strips and sacrificial material strips. Laterally alternating sequences of memory opening fill structures and dielectric pillar structures are formed within the line trenches. Each of the memory opening fill structures includes a respective vertical bit line and memory material portion located between each laterally neighboring pair of the sacrificial material strip and the vertical bit line. A lateral extent of an overlap between the memory material portion and a most proximal one of the sacrificial material strips along the first horizontal direction is less than a lateral extent along the first horizontal direction of the memory opening fill structure containing the memory material portion. The sacrificial material strips are replaced with electrically conductive strips.

20 Claims, 33 Drawing Sheets

(56) References Cited

U.S. PATENT DOCUMENTS

| | | |
|---|---|---|
| 9,356,031 B2 | 5/2016 | Lee et al. |
| 9,397,093 B2 | 7/2016 | Makala et al. |
| 9,449,981 B2 | 9/2016 | Pachamuthu et al. |
| 9,576,975 B2 | 2/2017 | Zhang et al. |
| 9,620,712 B2 | 4/2017 | Hayashi et al. |
| 9,646,988 B2 * | 5/2017 | Murakami ...... H01L 21/823462 |
| 9,666,799 B2 | 5/2017 | Yanagida et al. |
| 10,050,194 B1 | 8/2018 | Nardi et al. |
| 10,115,897 B1 | 10/2018 | Sato |
| 10,249,683 B1 | 4/2019 | Lille et al. |
| 2010/0207195 A1 * | 8/2010 | Fukuzumi ......... H01L 27/11578 257/326 |
| 2012/0261722 A1 * | 10/2012 | Tang ................... H01L 27/249 257/202 |
| 2016/0149126 A1 | 5/2016 | Pio |
| 2016/0196879 A1 | 7/2016 | Helm et al. |
| 2016/0365351 A1 * | 12/2016 | Nishikawa .......... H01L 27/1157 |
| 2017/0025421 A1 * | 1/2017 | Sakakibara ....... H01L 29/40117 |
| 2017/0194346 A1 * | 7/2017 | Lee ................... H01L 21/31111 |
| 2017/0271261 A1 * | 9/2017 | Tsutsumi ............ H01L 27/1157 |
| 2018/0122904 A1 | 5/2018 | Matsumoto et al. |

OTHER PUBLICATIONS

U.S. Appl. No. 16/002,243, filed Jun. 7, 2018, Sandisk Technologies LLC.

U.S. Appl. No. 16/002,169, filed Jun. 7, 2018, Sandisk Technologies LLC.

U.S. Appl. No. 15/844,005, filed Dec. 15, 2017, Sandisk Technologies LLC.

U.S. Appl. No. 16/440,250, filed Jun. 19, 2019, Sandisk Technologies LLC.

Notification of Transmittal of the International Search Report and Written Opinion of the International Search Authority or International Patent Application No. PCT/US2020/021868, dated Jun. 24, 2020, 11 pages.

* cited by examiner

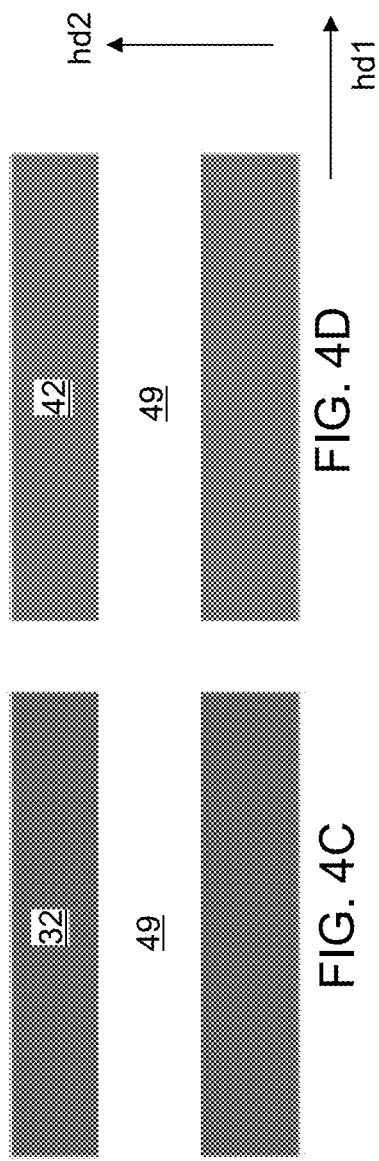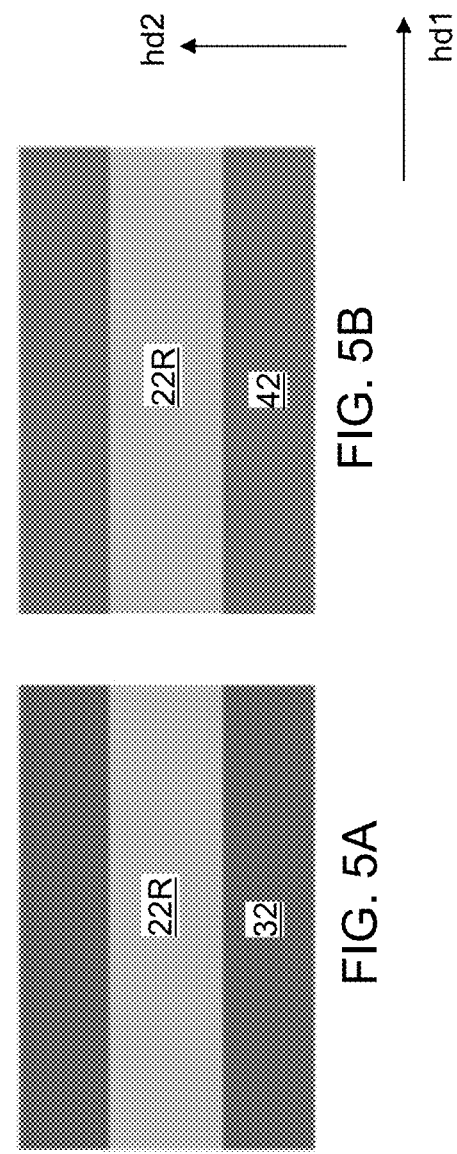

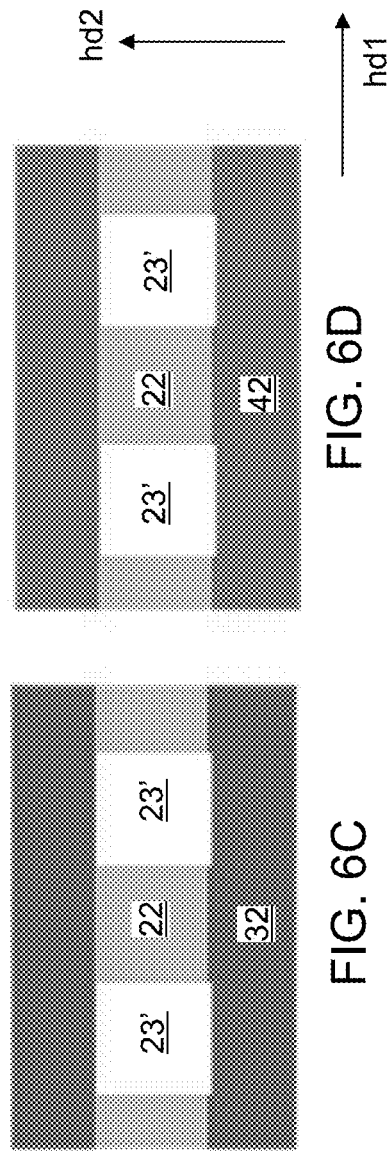
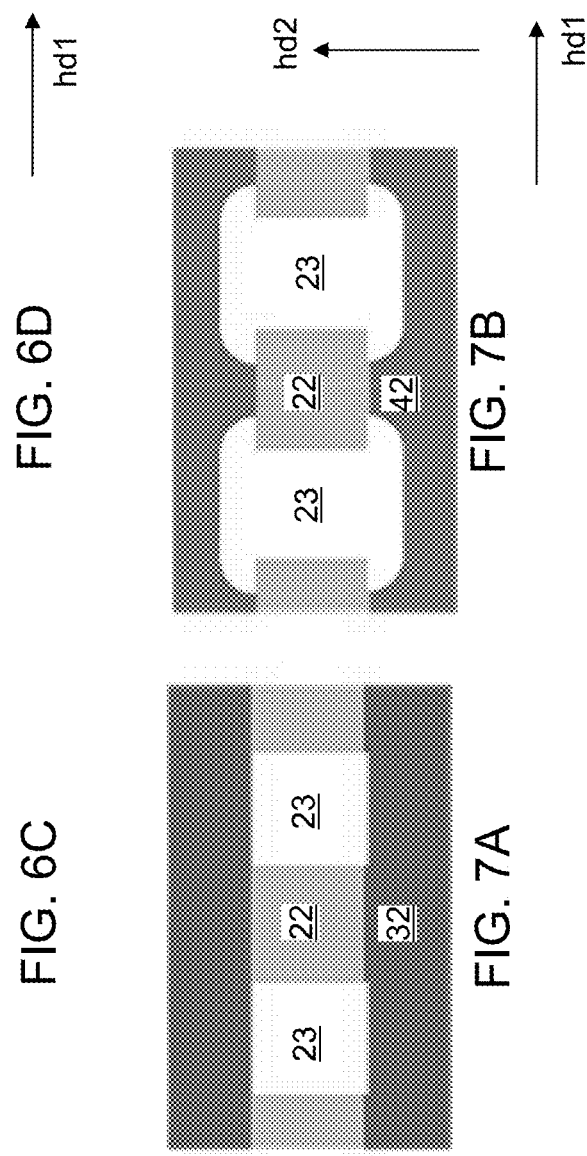
FIG. 6C  FIG. 6D
FIG. 7A  FIG. 7B

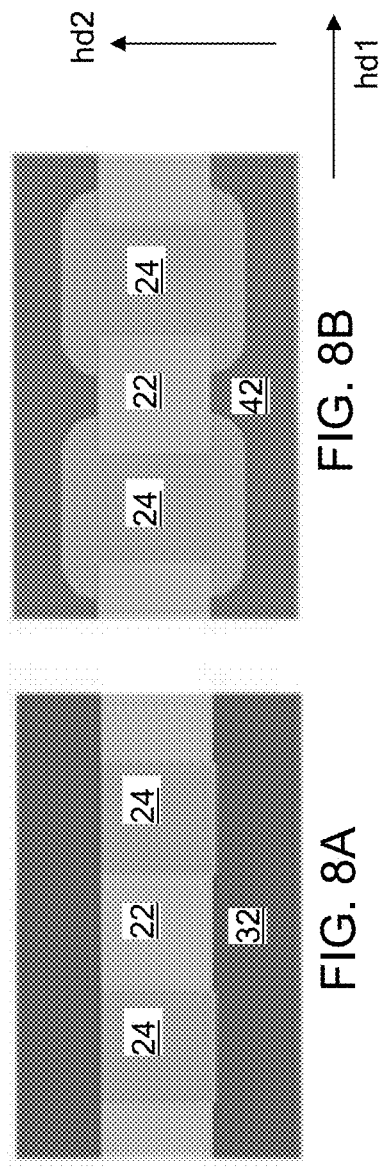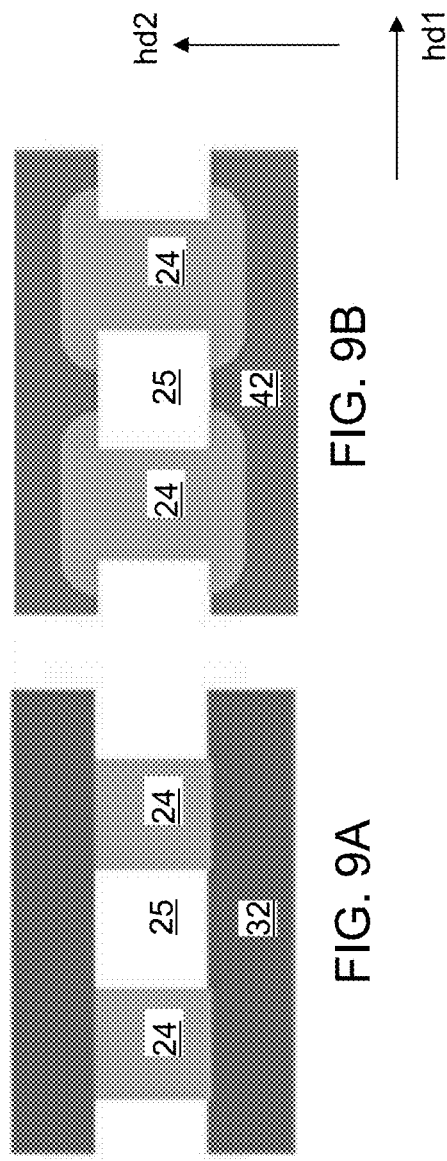

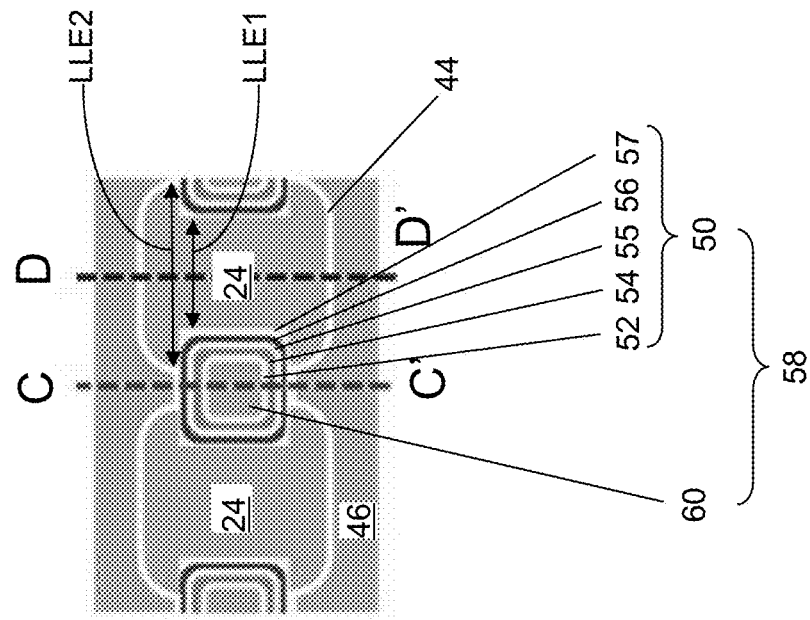
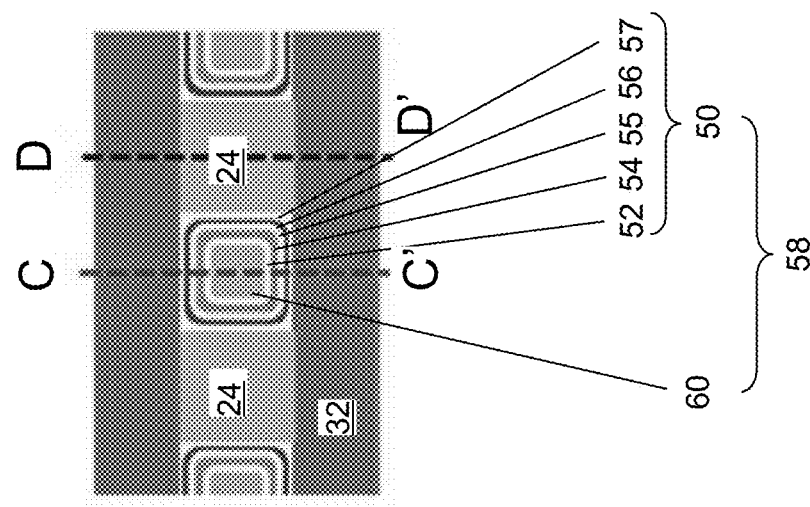
FIG. 13B
FIG. 13A

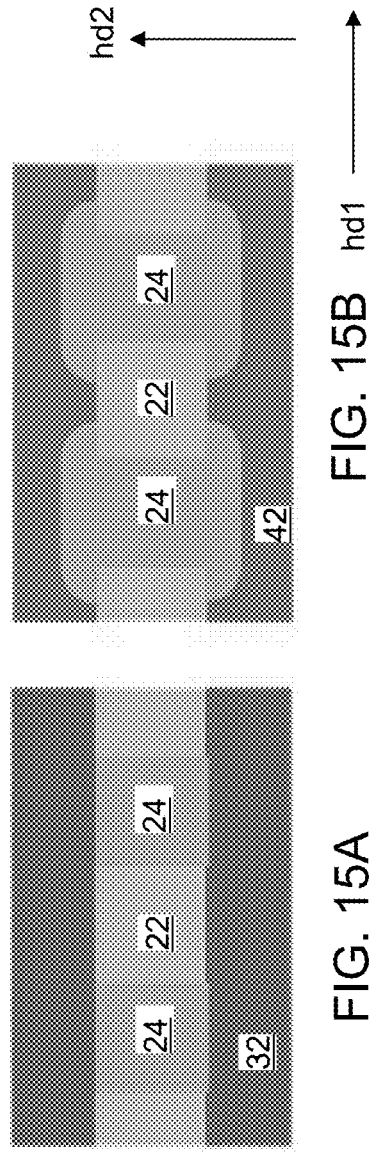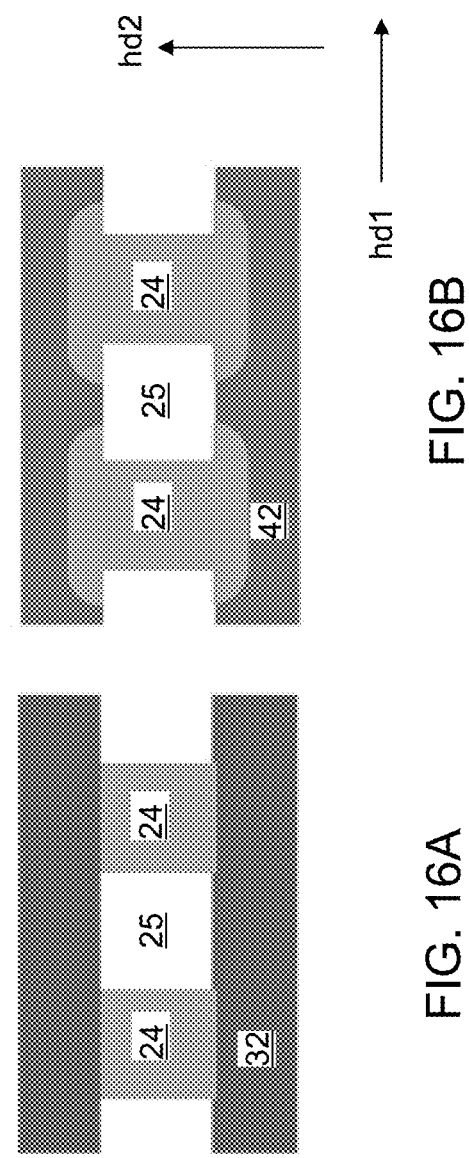
FIG. 15A FIG. 15B FIG. 16A FIG. 16B

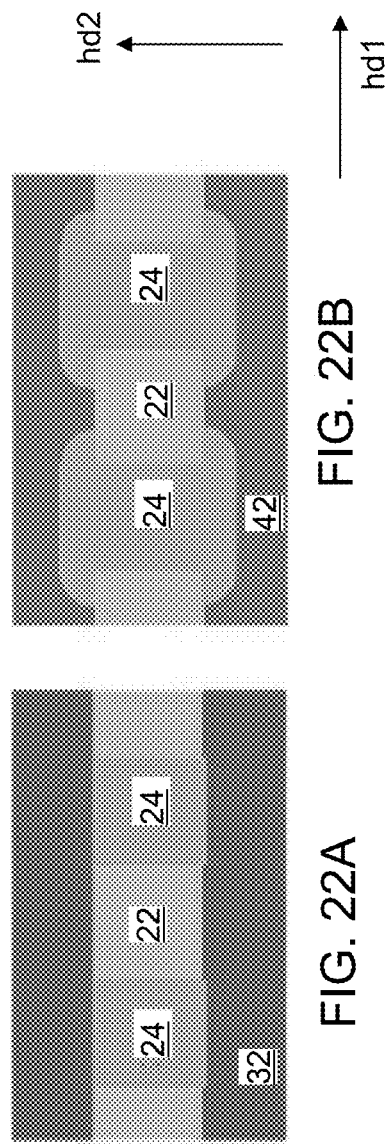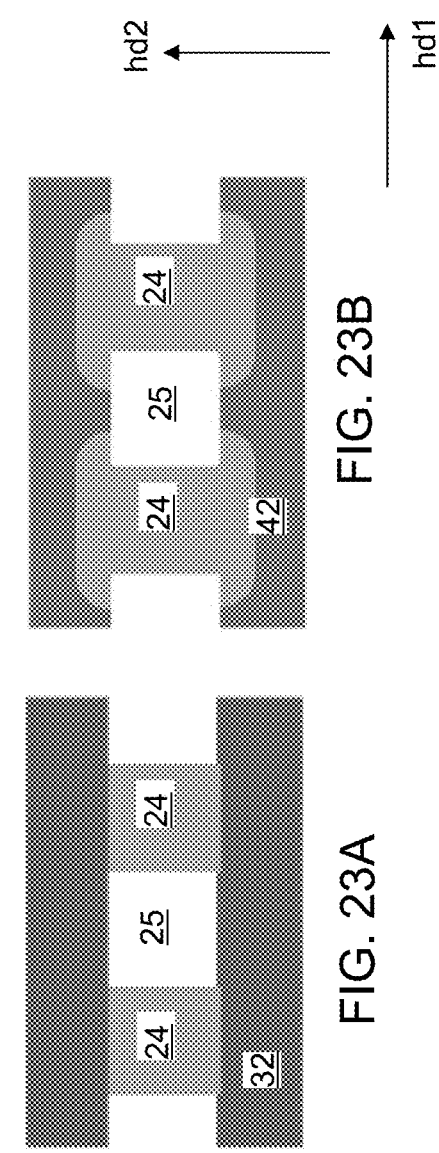

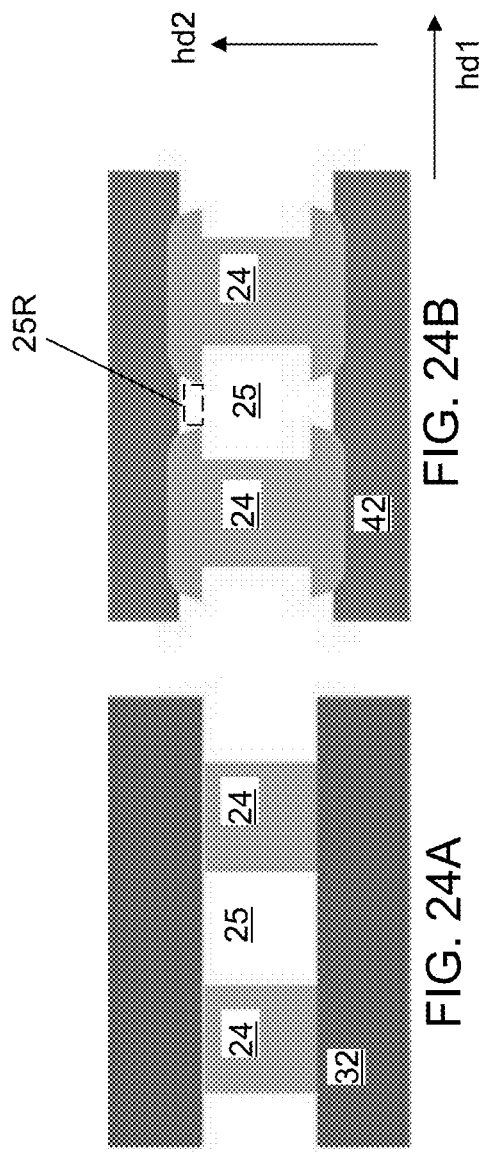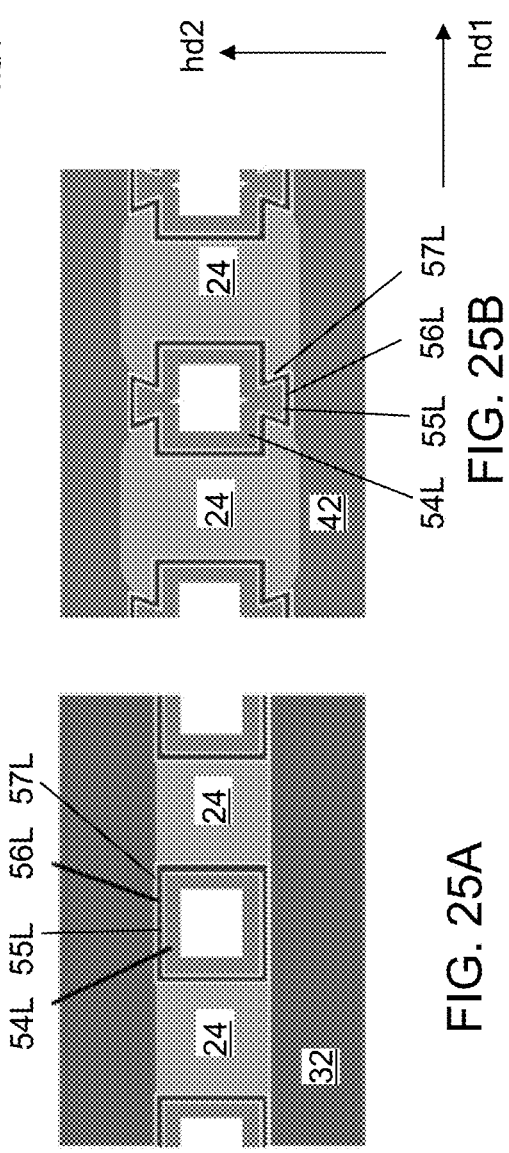

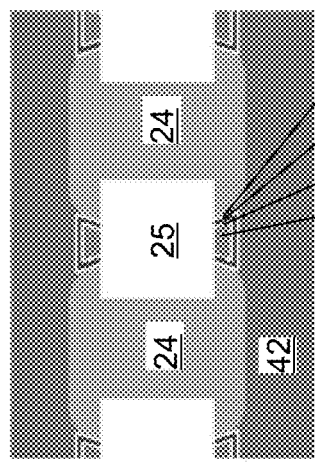
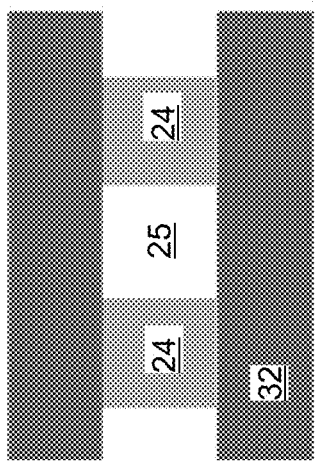
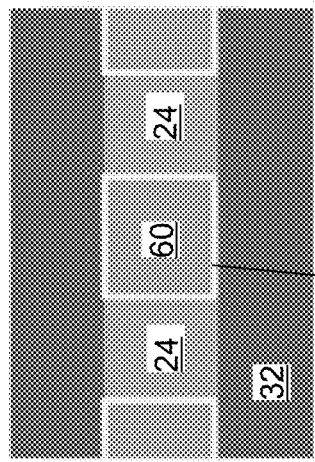

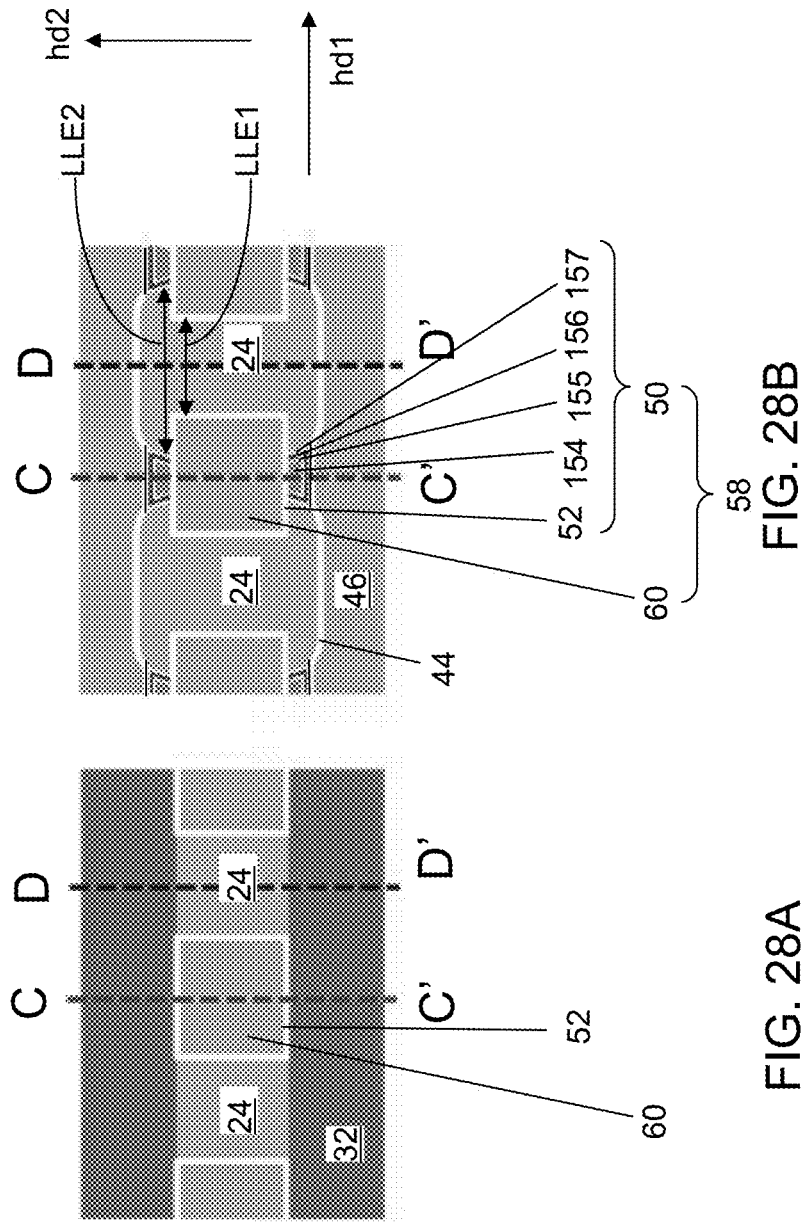

THREE-DIMENSIONAL MEMORY DEVICE INCLUDING LATERALLY CONSTRICTED CURRENT PATHS AND METHODS OF MANUFACTURING THE SAME

FIELD

The present disclosure relates generally to the field of semiconductor devices, and particular to a three-dimensional memory device containing laterally constricted current paths and methods of manufacturing the same.

BACKGROUND

A phase change material (PCM) memory device (also known as a phase change random access memory "PCRAM" or "PRAM") is a type of non-volatile memory device that stores information as a resistivity state of a material that can be in different resistivity states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change material amorphous in a first part of a programming process. The second part of the programming process includes control of the cooling rate of the phase change material. If rapid quenching occurs, the phase change material can cool into an amorphous high resistivity state. If slow cooling occurs, the phase change material can cool into a crystalline low resistivity state.

SUMMARY

According to an aspect of the present disclosure, a three-dimensional memory device comprises vertically alternating stacks of insulating strips and electrically conductive strips that overlie a substrate and are laterally spaced from each other by line trenches that laterally extend along a first horizontal direction, and laterally alternating sequences of memory opening fill structures and dielectric pillar structures located within a respective one of the line trenches. Each memory opening fill structure comprising a respective vertical bit line and a memory material portion, and the memory material portion is located between the vertical bit line and a respective electrically conductive strip. The insulating strips and the electrically conductive strips laterally extend along the first horizontal direction and the vertically alternating stacks are laterally spaced apart along a second horizontal direction that is perpendicular to the first horizonal direction. A lateral extent of an overlap between the memory material portion and a most proximal one of the electrically conductive strips along the first horizontal direction is less than a lateral extent along the first horizontal direction of the memory opening fill structure containing the memory material portion.

According to another aspect of the present disclosure, a method of forming a three-dimensional memory device is provided, which comprises: forming an vertically alternating sequence of insulating layers and sacrificial material layers over a substrate; forming line trenches extending along a first horizontal direction through the vertically alternating sequence, wherein the vertically alternating sequence is divided into vertically alternating stacks of insulating strips and sacrificial material strips that are laterally spaced apart along a second horizontal direction; forming laterally alternating sequences of memory opening fill structures and dielectric pillar structures within the line trenches, wherein each of the memory opening fill structures comprises a vertical bit line and a memory material portion located between each laterally neighboring pair of a sacrificial material strip and the vertical bit line, wherein a lateral extent of an overlap between the memory material portion and a most proximal one of the sacrificial material strips along the first horizontal direction is less than a lateral extent along the first horizontal direction of the memory opening fill structure containing the memory material portion; and replacing the sacrificial material strips with electrically conductive strips.

BRIEF DESCRIPTION OF THE DRAWINGS

FIG. 4C is a horizontal cross-sectional view of a region of the first exemplary structure along the horizontal plane C-C' of FIG. 4A.

FIG. 4D is a horizontal cross-sectional view of a region of the first exemplary structure along the horizontal plane D-D' of FIG. 4A.

FIG. 5A is a first horizontal cross-sectional view of a region of the first exemplary structure after formation of a sacrificial rail structure within each line trench according to an embodiment of the present disclosure.

FIG. 5B is a second horizontal cross-sectional view of a region of the first exemplary structure after formation of a sacrificial rail structure within each line trench according to an embodiment of the present disclosure.

FIG. 6C is a horizontal cross-sectional view of a region of the first exemplary structure along the horizontal plane C-C' of FIG. 6A.

FIG. 6D is a horizontal cross-sectional view of a region of the first exemplary structure along the horizontal plane D-D' of FIG. 6A.

FIG. 7A is a first horizontal cross-sectional view of a region of the first exemplary structure after laterally recessing sacrificial material strips around each via cavity according to an embodiment of the present disclosure.

FIG. 7B is a second horizontal cross-sectional view of a region of the first exemplary structure after laterally recessing sacrificial material layers around each via cavity according to an embodiment of the present disclosure.

FIG. 8A is a first horizontal cross-sectional view of a region of the first exemplary structure after formation of dielectric pillar structures in the via cavities according to an embodiment of the present disclosure.

FIG. 8B is a second horizontal cross-sectional view of a region of the first exemplary structure after formation of dielectric pillar structures in the via cavities according to an embodiment of the present disclosure.

FIG. 9A is a first horizontal cross-sectional view of a region of the first exemplary structure after formation of rectangular memory openings by removal of the sacrificial pillar structures according to an embodiment of the present disclosure.

FIG. 9B is a second horizontal cross-sectional view of a region of the first exemplary structure after formation of rectangular memory openings by removal of the sacrificial pillar structures according to an embodiment of the present disclosure.

FIG. 13A is a first horizontal cross-sectional view of a region of the first exemplary structure after formation of a barrier dielectric layer and an electrically conductive strip within each backside recess according to an embodiment of the present disclosure.

FIG. 13B is a second horizontal cross-sectional view of a region of the first exemplary structure after formation of a barrier dielectric layer and an electrically conductive strip within each backside recess according to an embodiment of the present disclosure.

FIG. 15A is a first horizontal cross-sectional view of a region of a second exemplary structure after formation of dielectric pillar structures according to an embodiment of the present disclosure.

FIG. 15B is a second first horizontal cross-sectional view of a region of the second exemplary structure after formation of dielectric pillar structures according to an embodiment of the present disclosure.

FIG. 16A is a first horizontal cross-sectional view of a region of the second exemplary structure after formation of rectangular memory openings according to an embodiment of the present disclosure.

FIG. 16B is a second first horizontal cross-sectional view of a region of the second exemplary structure after formation of rectangular memory openings according to an embodiment of the present disclosure.

FIG. 22A is a first horizontal cross-sectional view of a region of a third exemplary structure after formation of dielectric pillar structures according to an embodiment of the present disclosure.

FIG. 22B is a third first horizontal cross-sectional view of a region of the third exemplary structure after formation of dielectric pillar structures according to an embodiment of the present disclosure.

FIG. 23A is a first horizontal cross-sectional view of a region of the third exemplary structure after formation of rectangular memory openings according to an embodiment of the present disclosure.

FIG. 23B is a third first horizontal cross-sectional view of a region of the third exemplary structure after formation of rectangular memory openings according to an embodiment of the present disclosure.

FIG. 24A is a first horizontal cross-sectional view of a region of the third exemplary structure after formation of lateral recesses according to an embodiment of the present disclosure.

FIG. 24B is a third first horizontal cross-sectional view of a region of the third exemplary structure after formation of lateral recesses according to an embodiment of the present disclosure.

FIG. 25A is a first horizontal cross-sectional view of a region of the third exemplary structure after deposition of a selector material layer and a memory material layer according to an embodiment of the present disclosure.

FIG. 25B is a third first horizontal cross-sectional view of a region of the third exemplary structure after deposition of the selector material layer and the memory material layer according to an embodiment of the present disclosure.

FIG. 26A is a first horizontal cross-sectional view of a region of the third exemplary structure after formation of selector material portions and memory material portions according to an embodiment of the present disclosure.

FIG. 26B is a third first horizontal cross-sectional view of a region of the third exemplary structure after formation of the selector material portions and the memory material portions according to an embodiment of the present disclosure.

FIG. 27A is a first horizontal cross-sectional view of a region of the third exemplary structure after formation of memory opening fill structures according to an embodiment of the present disclosure.

FIG. 27B is a third first horizontal cross-sectional view of a region of the third exemplary structure after formation of memory opening fill structures according to an embodiment of the present disclosure.

FIG. 28A is a first horizontal cross-sectional view of a region of the third exemplary structure after replacement of sacrificial material strips with electrically conductive strips according to an embodiment of the present disclosure.

FIG. 28B is a third first horizontal cross-sectional view of a region of the third exemplary structure after replacement of sacrificial material strips with electrically conductive strips according to an embodiment of the present disclosure.

DETAILED DESCRIPTION

Figure 1:
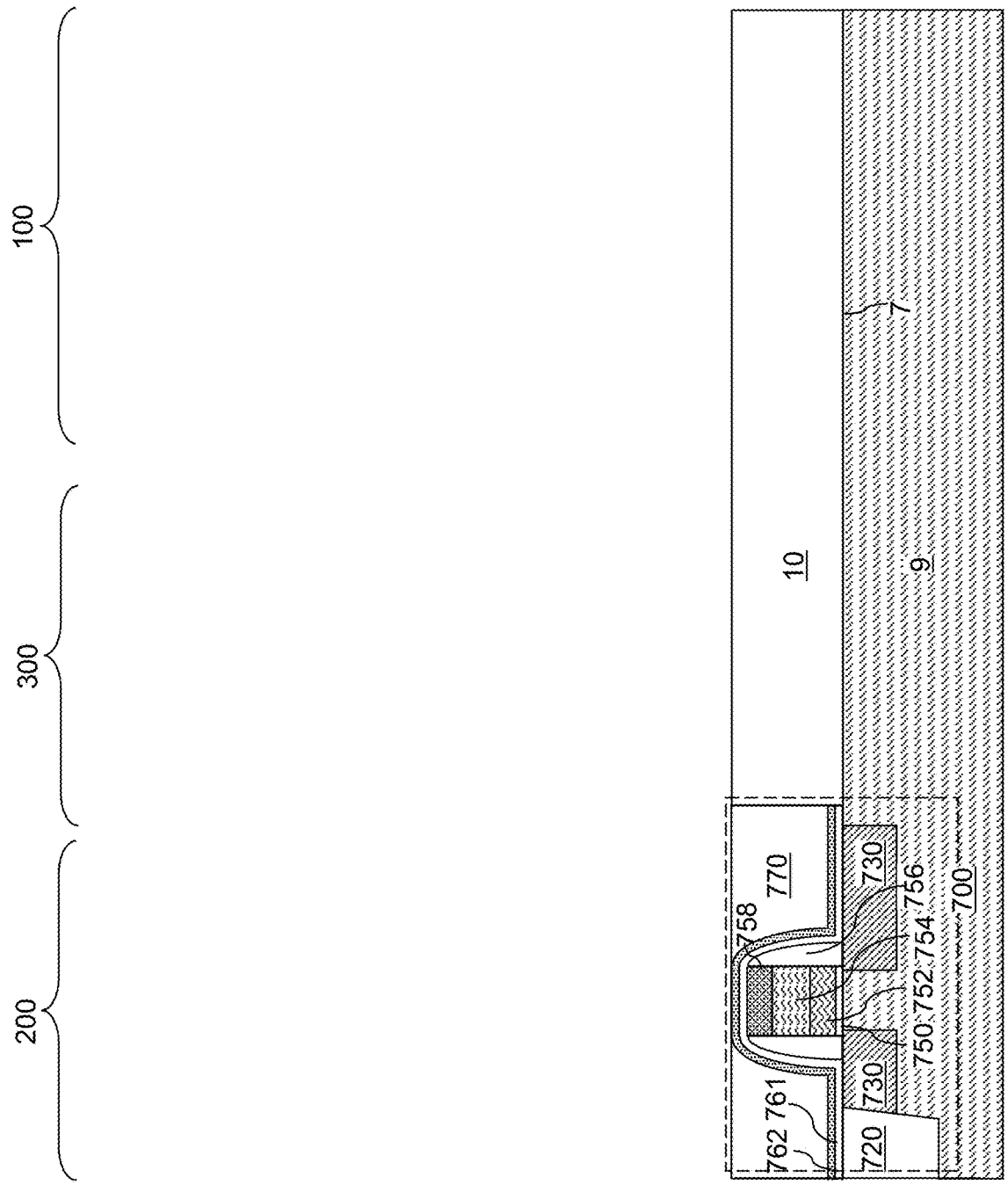
FIG. 1 is a schematic vertical cross-sectional view of a first exemplary structure after formation of at least one peripheral device and an insulating material layer according to an embodiment of the present disclosure.

As discussed above, the embodiments of the present disclosure are directed to three-dimensional phase change memory devices including laterally constricted current paths between the word lines and the phase change material in each memory cell and methods of manufacturing the same.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function.

Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Referring to FIG. 1, a first exemplary structure according to a first embodiment of the present disclosure is illustrated, which can be employed, for example, to fabricate a three-dimensional phase change memory device. The first exemplary structure includes a substrate 9. The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one phase change memory device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

An insulating material layer 10 is formed on the top surface of the substrate semiconductor layer 9 prior to, or after, formation of the at least one semiconductor device 700 by deposition of an insulating material, for example, by chemical vapor deposition. The insulating material layer can be any insulating material, such as silicon oxide, and may have a thickness of 50 nm to 300 nm. Portions of the deposited insulating material located above the top surface of the planarization dielectric layer 770 can be removed, for example, by chemical mechanical planarization (CMP). In this case, the insulating material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
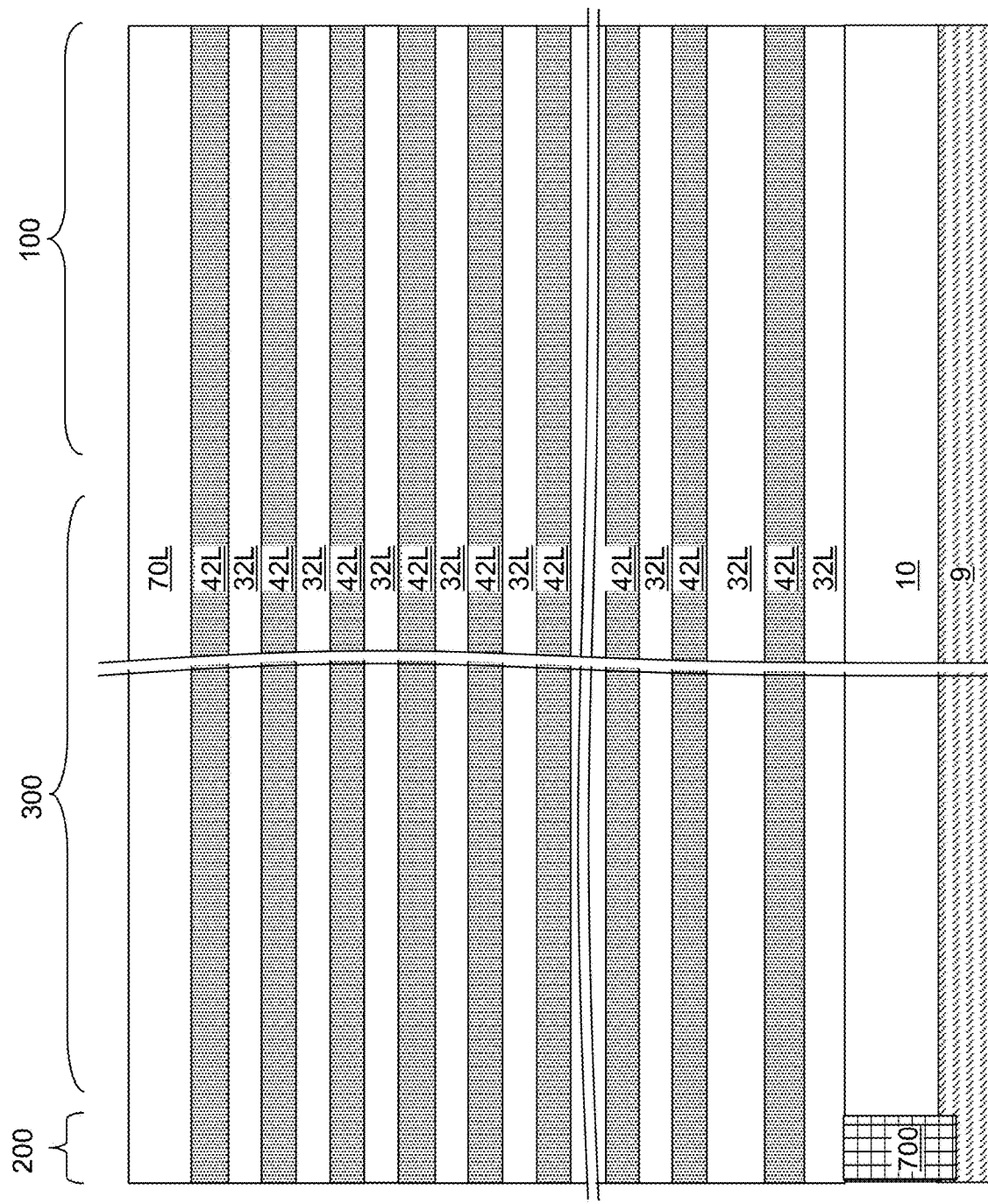
FIG. 2 is a schematic vertical cross-sectional view of the first exemplary structure after formation of a vertically alternating sequence of insulating layers and sacrificial material layers according to an embodiment of the present disclosure.

Referring to FIG. 2, a stack of an alternating plurality of first material layers (which can be insulating layers 32L) and second material layers (which can be sacrificial material layer 42L) is formed over the top surface of the substrate 9. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32L, and each second material layer can be a sacrificial material layer. In this case, the stack can include an alternating plurality of insulating layers 32L and sacrificial material layers 42L, and constitutes a prototype stack of alternating layers comprising insulating layers 32L and sacrificial material layers 42L.

The stack of the alternating plurality is herein referred to as a vertically alternating sequence (32L, 42L). In one embodiment, the vertically alternating sequence (32L, 42L) can include insulating layers 32L composed of the first material, and sacrificial material layers 42L composed of a second material different from that of insulating layers 32L. The first material of the insulating layers 32L can be at least one insulating material. As such, each insulating layer 32L can be an insulating material layer. Insulating materials that can be employed for the insulating layers 32L include, but are not limited to, silicon oxide (including doped or undoped silicate glass), silicon nitride, silicon oxynitrides, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32L can be silicon oxide.

The second material of the sacrificial material layers 42L is a sacrificial material that can be removed selective to the first material of the insulating layers 32L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42L may comprise an insulating material, a semiconductor material, or a conductive material. The second material of the sacrificial material layers 42L can be subsequently replaced with electrically conductive electrodes which can function, for example, as word lines of a phase change memory device. Non-limiting examples of the second material include silicon nitride, an amorphous semiconductor material (such as amorphous silicon), and a polycrystalline semiconductor material (such as polysilicon). In one embodiment, the sacrificial material layers 42L can be spacer material layers that comprise silicon nitride or a semiconductor material including at least one of silicon and germanium.

In one embodiment, the insulating layers 32L can include silicon oxide, and sacrificial material layers can include silicon nitride sacrificial material layers. The first material of the insulating layers 32L can be deposited, for example, by chemical vapor deposition (CVD). For example, if silicon oxide is employed for the insulating layers 32L, tetraethyl orthosilicate (TEOS) can be employed as the precursor material for the CVD process. The second material of the sacrificial material layers 42L can be formed, for example, CVD or atomic layer deposition (ALD).

The sacrificial material layers 42L can be suitably patterned so that conductive material portions to be subsequently formed by replacement of the sacrificial material layers 42L can function as electrically conductive electrodes, such as word lines of a phase change memory device to be subsequently formed. The sacrificial material layers 42L may comprise a portion having a strip shape extending substantially parallel to the major surface 7 of the substrate.

The thicknesses of the insulating layers 32L and the sacrificial material layers 42L can be in a range from 20 nm to 50 nm, although lesser and greater thicknesses can be employed for each insulating layer 32L and for each sacrificial material layer 42L. The number of repetitions of the pairs of an insulating layer 32L and a sacrificial material layer (e.g., a control gate electrode or a sacrificial material layer) 42L can be in a range from 2 to 1,024, and typically from 8 to 256, although a greater number of repetitions can also be employed. The top and bottom gate electrodes in the stack may function as the select gate electrodes. In one embodiment, each sacrificial material layer 42L in the vertically alternating sequence (32L, 42L) can have a uniform thickness that is substantially invariant within each respective sacrificial material layer 42L.

Optionally, an insulating cap layer 70L can be formed over the vertically alternating sequence (32L, 42L). The insulating cap layer 70L includes a dielectric material that is different from the material of the sacrificial material layers 42L. In one embodiment, the insulating cap layer 70L can include a dielectric material that can be employed for the insulating layers 32L as described above. The insulating cap layer 70L can have a greater thickness than each of the insulating layers 32L. The insulating cap layer 70L can be deposited, for example, by chemical vapor deposition. In one embodiment, the insulating cap layer 70L can be a silicon oxide layer.

Figure 3:
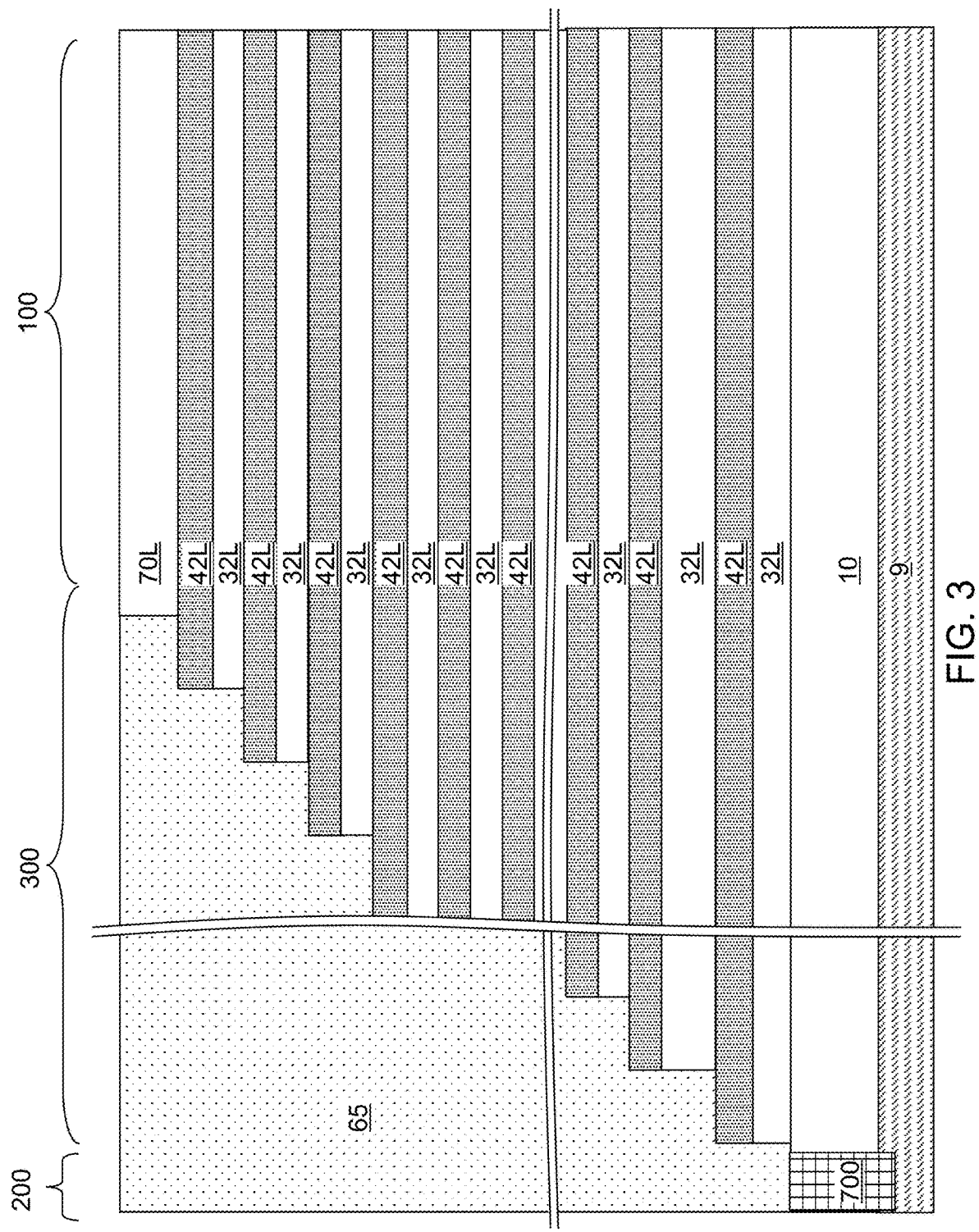
FIG. 3 is a schematic vertical cross-sectional view of the first exemplary structure after formation of stepped terraces and a retro-stepped dielectric material portion according to an embodiment of the present disclosure.
Figure 4A:
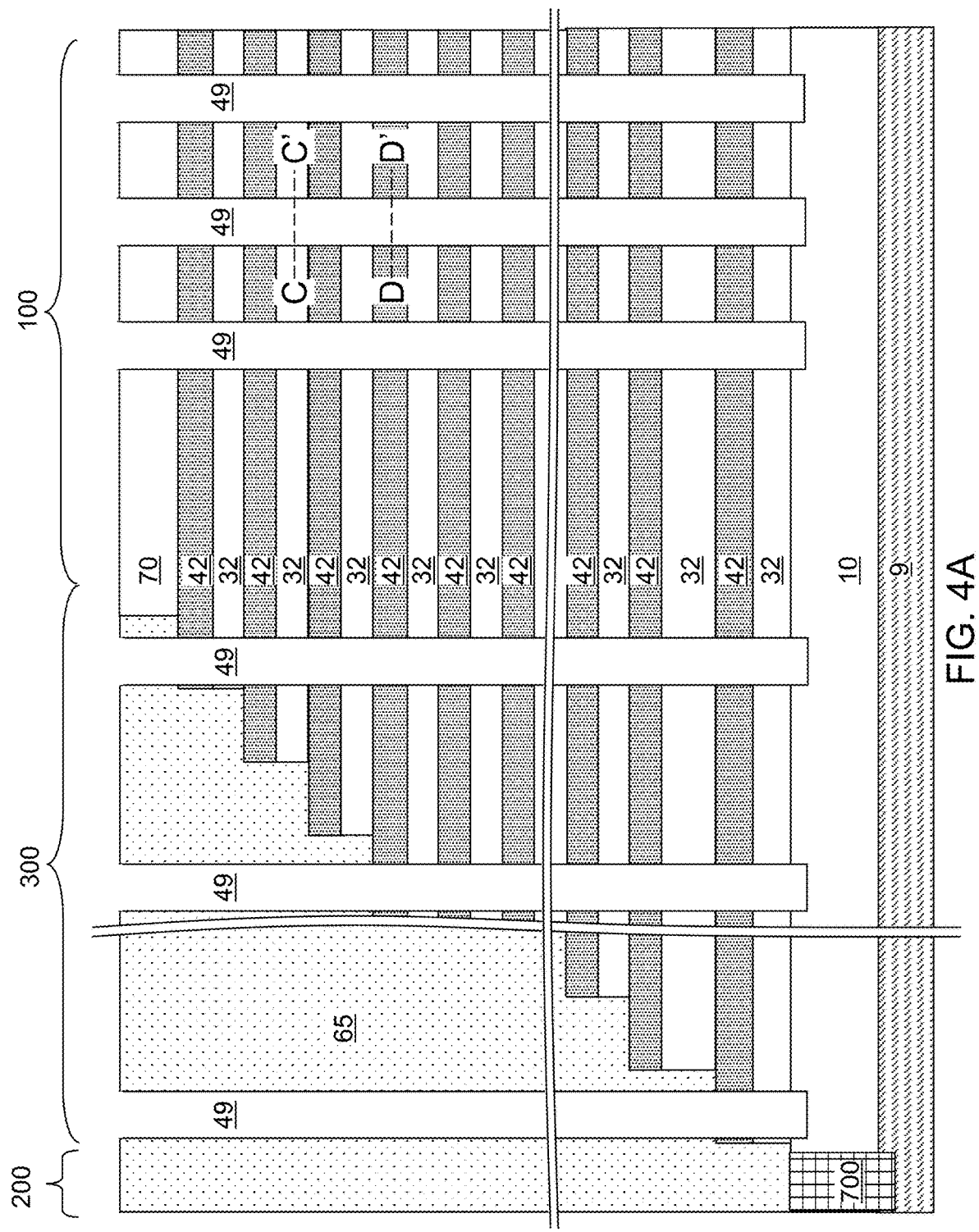
FIG. 4A is a schematic vertical cross-sectional view of the first exemplary structure after formation of line trenches according to an embodiment of the present disclosure.
Figure 4B:
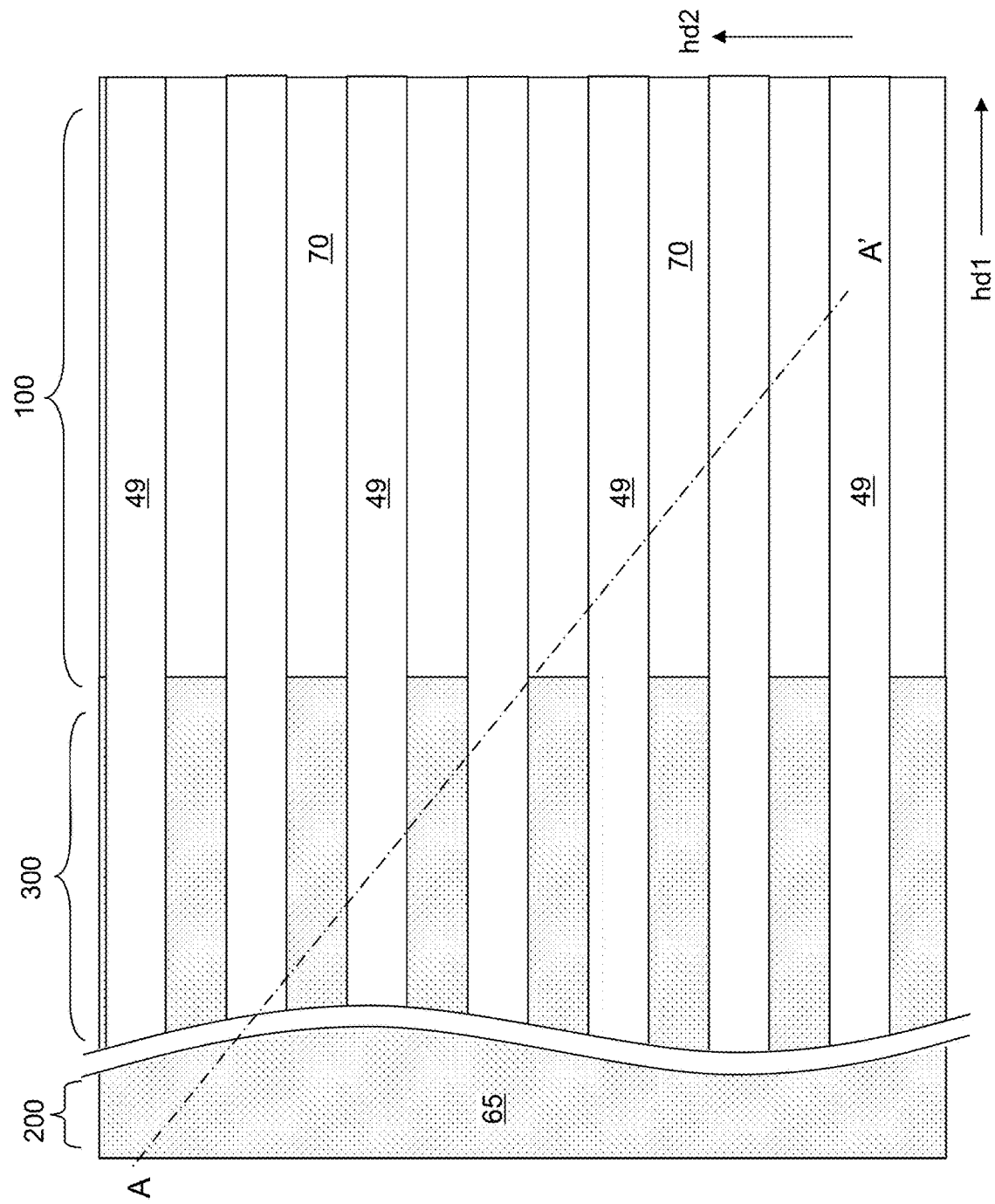
FIG. 4B is a top-down view of the first exemplary structure of FIG. 4A. The vertical plane A-A' is the plane of the cross-section for FIG. 4A.
Figure 6A:
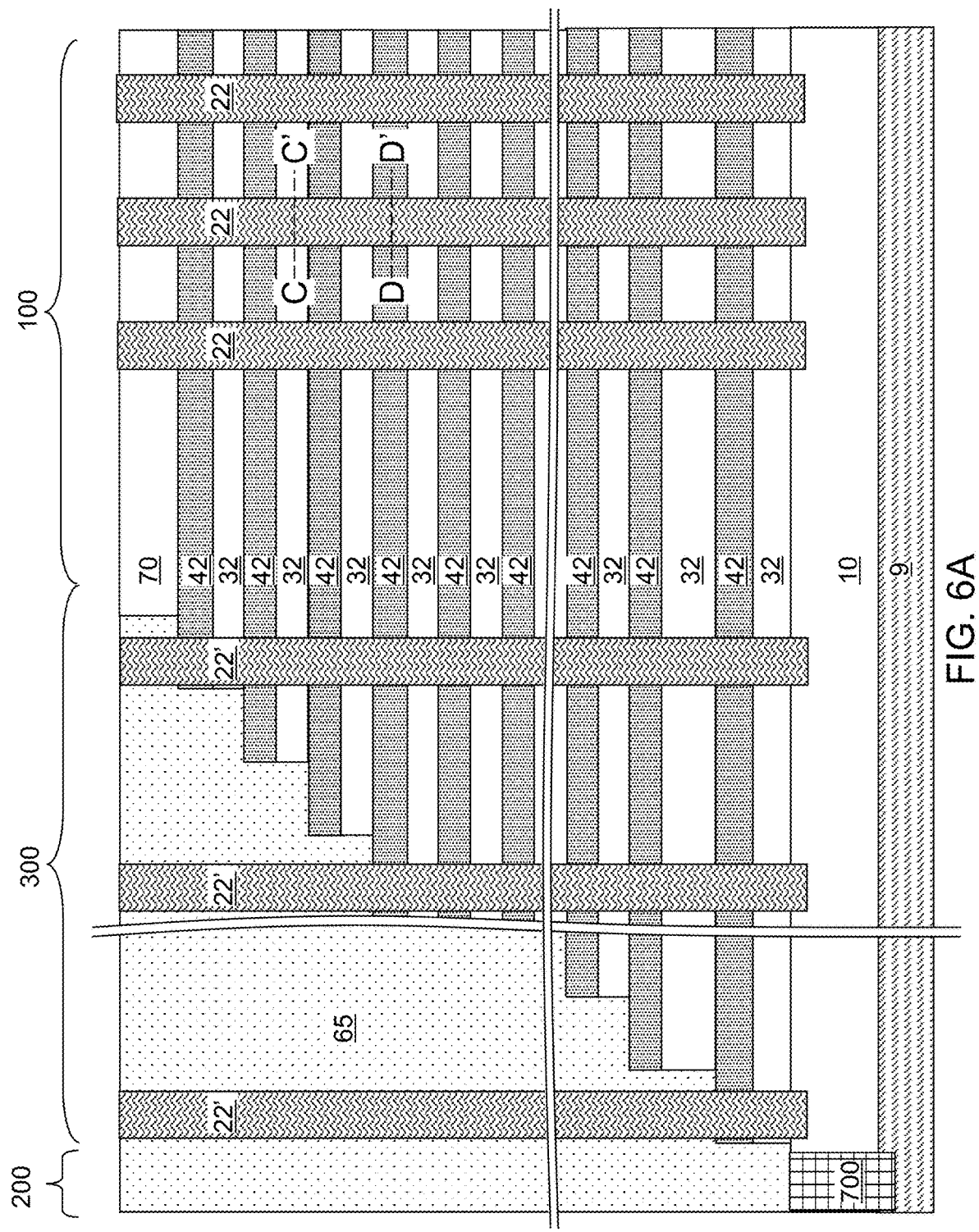
FIG. 6A is a schematic vertical cross-sectional view of the first exemplary structure after formation of sacrificial pillar structures and via cavities in the line trenches according to an embodiment of the present disclosure.
Figure 6B:
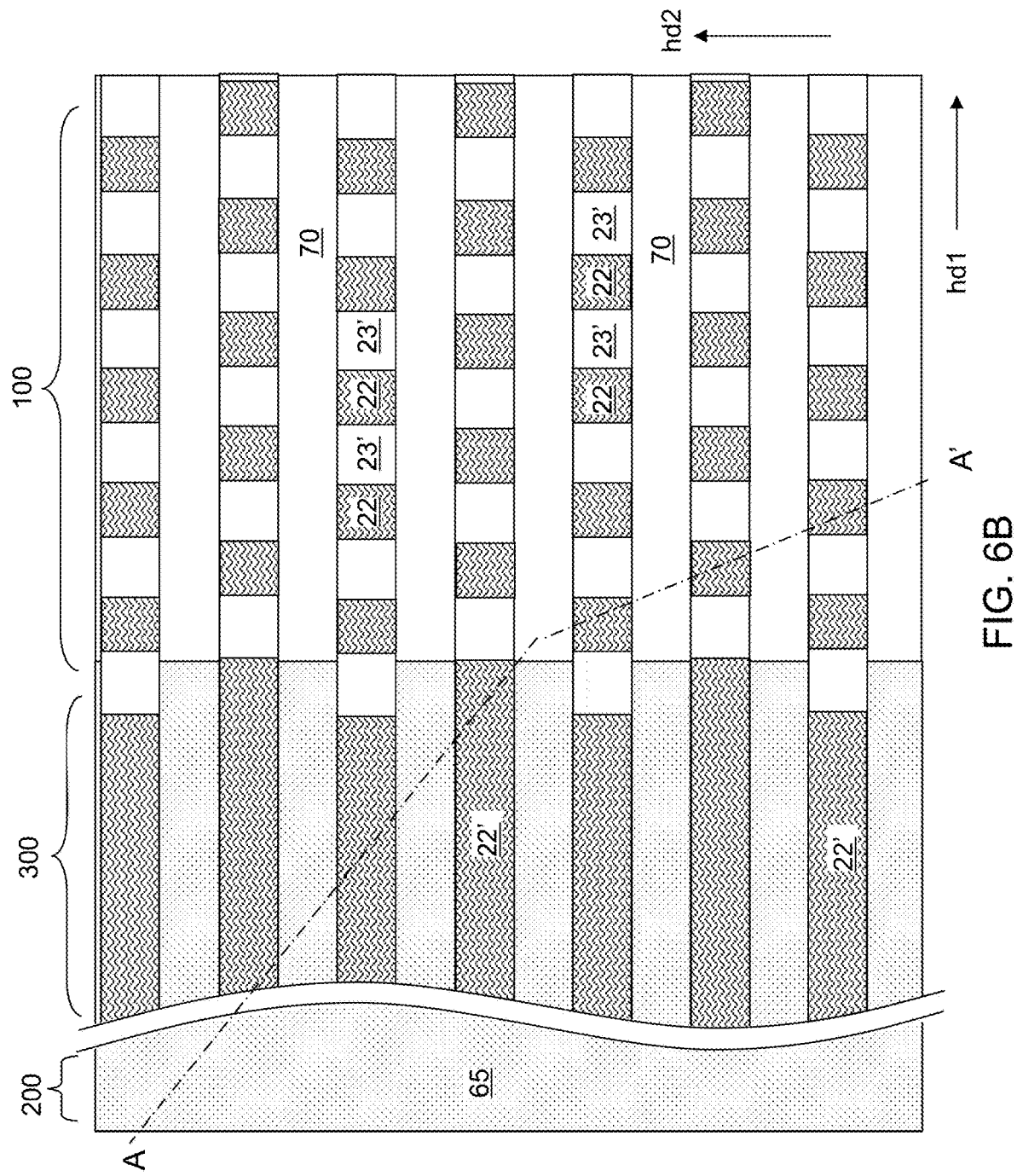
FIG. 6B is a top-down view of the first exemplary structure of FIG. 6A. The vertical plane A-A' is the plane of the cross-section for FIG. 6A.

Referring to FIG. 3, stepped surfaces are formed at a peripheral region of the vertically alternating sequence (32L, 42L), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the vertically alternating sequence (32L, 42L) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 9.

In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42L other than a topmost sacrificial material layer 42L within the vertically alternating sequence (32L, 42L) laterally extends farther than any overlying sacrificial material layer 42L within the vertically alternating sequence (32L, 42L) in the terrace region. The terrace region includes stepped surfaces of the vertically alternating sequence (32L, 42L) that continuously extend from a bottommost layer within the vertically alternating sequence (32L, 42L) to a topmost layer within the vertically alternating sequence (32L, 42L).

Each vertical step of the stepped surfaces can have the height of one or more pairs of an insulating layer 32L and a sacrificial material layer. In one embodiment, each vertical step can have the height of a single pair of an insulating layer 32L and a sacrificial material layer 42L. In another embodiment, multiple "columns" of staircases can be formed along a first horizontal direction hd1 such that each vertical step has the height of a plurality of pairs of an insulating layer 32L and a sacrificial material layer 42L, and the number of columns can be at least the number of the plurality of pairs. Each column of staircase can be vertically offset among one another such that each of the sacrificial material layers 42L has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42L (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42L may also be employed. Each sacrificial material layer 42L has a greater lateral extent, at least along one direction, than any overlying sacrificial material layers 42L such that each physically exposed surface of any sacrificial material layer 42L does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70L, for example, by chemical mechanical planarization (CMP).

The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 4A-4D, a lithographic material stack (not shown) including at least a photoresist layer can be formed over the insulating cap layer 70L and the retro-stepped dielectric material portion 65, and can be lithographically patterned to form line-shaped openings therein. The line-shaped openings laterally extend along a first horizontal direction hd1, and have a uniform width along a second horizontal direction hd2 that is perpendicular to the first horizontal direction hd1. The pattern in the lithographic material stack can be transferred through the insulating cap layer 70L or the retro-stepped dielectric material portion 65, and through the vertically alternating sequence (32L, 42L) by at least one anisotropic etch that employs the patterned lithographic material stack as an etch mask. Portions of the vertically alternating sequence (32L, 42L) underlying the line-shaped openings in the patterned lithographic material stack are etched to form line trenches 49. As used herein, a "line trench" refers to a trench that has laterally extends straight along a horizontal direction.

The line trenches 49 laterally extend along the first horizontal direction hd1 (e.g., word line direction) through the vertically alternating sequence (32, 42). In one embodiment, the line trenches 49 have a respective uniform width that is invariant under translation along the first horizontal direction hd1. In one embodiment, the line trenches 49 can have the same width throughout, and the spacing between neighboring pairs of the line trenches 49 can be the same. In this case, the line trenches 49 can constitute a one-dimensional periodic array of line trenches 49 having a pitch along a second horizontal direction hd2 (e.g., bit line direction) that is perpendicular to the first horizontal direction hd1. The width of the line trenches 49 along the second horizontal direction hd2 can be in a range from 30 nm to 500 nm, such as from 60 nm to 250 nm, although lesser and greater widths can also be employed.

The line trenches 49 extend through each layer of the vertically alternating sequence (32, 42) and the retro-stepped dielectric material portion 65. The chemistry of the anisotropic etch process employed to etch through the materials of the vertically alternating sequence (32L, 42L) can alternate to optimize etching of the first and second materials in the vertically alternating sequence (32L, 42L). The anisotropic etch can be, for example, a series of reactive ion etches. The sidewalls of the line trenches 49 can be substantially vertical, or can be tapered. The patterned lithographic material stack can be subsequently removed, for example, by ashing.

The line trenches 49 laterally extend through the entire memory array region 100, and laterally extend into the contact region 300. The line trenches 49 may laterally extend through the entire contact region 300 along the first horizontal direction hd1, or may laterally extend only through part of a width, but not the entire width along the first horizontal direction hd1, of the contact region 300. In one embodiment, an overetch into the insulating material layer 10 may be optionally performed after the top surface of the insulating material layer 10 is physically exposed at a bottom of each line trench 49. The overetch may be performed prior to, or after, removal of the lithographic material stack. In other words, the recessed surfaces of the insulating material layer 10 may be vertically offset from the un-recessed top surfaces of the insulating material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the line trenches 49 can be coplanar with the topmost surface of the insulating material layer 10.

Each of the line trenches 49 may include a sidewall (or a plurality of sidewalls) that extends substantially perpendicular to the topmost surface of the substrate. Each patterned portion of an insulating layer 32L is herein referred to as an insulating strip 32, which can laterally extend along the first horizontal direction hd1 and is located between a respective neighboring pair of line trenches 49. Each patterned portion of a sacrificial material layer 42L is herein referred to as a sacrificial material strip 42, which can laterally extend along the first horizontal direction hd1 and is located between a respective neighboring pair of line trenches 49. Each patterned portion of the insulating cap layer 70L is herein referred to as an insulating cap strip 70, which can laterally extend along the first horizontal direction hd1 and is located between a respective neighboring pair of line trenches 49. The vertically alternating sequence (32L, 42L) is divided into vertically alternating stacks (32, 42) of insulating strips 32 and sacrificial material strips 42 that laterally extend along the first horizontal direction hd1, and are laterally spaced apart along a second horizontal direction hd2. A vertically alternating stack (32, 42) is also referred to as an alternating stack (32, 42) in the present disclosure.

Referring to FIGS. 5A and 5B, a sacrificial fill material is deposited in the line trenches 49. The sacrificial fill material comprises a material that can be removed selective to the materials of the insulating strips 32, the sacrificial material strips 42, and the insulating cap strips 70. For example, the sacrificial fill material can include amorphous silicon, a silicon-germanium alloy, amorphous carbon, diamond-like carbon, a polymer material, borosilicate glass, or organo-silicate glass. In one embodiment, a sacrificial liner such as a silicon oxide liner, a silicon nitride liner, or a dielectric oxide liner may be deposited prior to deposition of the sacrificial fill material in the line trenches 49. Excess portions of the sacrificial fill material can be removed from above the horizontal plane including the top surfaces of the insulating cap strips 70. Each remaining portion of the sacrificial fill material filling a respective line trench 49 constitutes a sacrificial rail structure 22R that laterally extends along the first horizontal direction hd1.

Referring to FIGS. 6A-6D, a photoresist layer can be applied over the vertically alternating stacks (32, 42) and the sacrificial rail structures 22R, and can be lithographically patterned to form a two-dimensional array of openings therethrough. The two-dimensional array of openings includes rows of opening arranged along the first horizontal direction hd1 and overly a respective one of the sacrificial rail structures 22R. An anisotropic etch process can be performed to etch portions of the material of the sacrificial rail structures 22R that are not masked by the patterned photoresist layer. In one embodiment, the chemistry of the anisotropic etch process can etch the material of the sacrificial rail structures 22R selective to the material of the insulating cap strips 70. In one embodiment, edges of the openings in the photoresist layer that overlie the sacrificial rail structures 22R can be parallel to the second horizontal direction hd2.

Via cavities 23' can be formed in the volumes from which portions of the sacrificial rail structures 22R are removed. Each via cavity 23' can vertically extend down to the top surface of the substrate 9, such as the top surface of the insulating material layer 10. In one embodiment, the via cavities 23' can comprise rectangular via cavities having a respective rectangular horizontal cross-sectional shape. Each remaining portion of the sacrificial rail structures 22R constitutes a sacrificial pillar structure 22. In one embodiment, each sacrificial pillar structure 22 can have a rectangular horizontal cross-sectional area. In one embodiment, a row of sacrificial pillar structures 22 can be interlaced with a row of via cavities 23' within each line trench 49.

Referring to FIGS. 7A and 7B, an isotropic etch process is performed to laterally recess the sacrificial material strips 42 selective to the insulating strips 32, the insulating cap strips 70, and the sacrificial pillar structures 22. In an illustrative example, the sacrificial material strips 42 include silicon nitride, the insulating strips 32 and the insulating cap strips 70 include silicon oxide, and the sacrificial pillar structures 22 can include amorphous silicon. In this case, a wet etch process employing hot phosphoric acid, a mixture of hydrofluoric acid and glycerol at an elevated temperature, or a mixture of ethylene glycol, acetic acid, nitric acid, and ammonium fluoride at an elevated temperature may be employed to laterally recess the sacrificial material strips 42 selective to the insulating strips 32, the insulating cap strips 70, and the sacrificial pillar structures 22.

In one embodiment, each of the sacrificial pillar structures 22 can have a same first rectangular horizontal cross-sectional shape, and each of the via cavities 23' can have a same second rectangular shape prior to the isotropic etch process. The lateral recess distance of the isotropic etch process can be less than one half of the dimension of each sacrificial pillar structure 22 along the first horizontal direction hd1. A laterally-undulating via cavity 23 is formed by lateral expansion of each via cavity 23' at the levels of the sacrificial material strips 42. Each of the laterally-undulating via cavities 23 has a vertical cross-sectional profile along vertical planes that are perpendicular to the first horizontal direction in which the respective laterally-undulating via cavity 23' laterally protrudes at each level of the sacrificial material strips 42. Each horizontal cross-sectional view of a laterally-undulating via cavities 23 at a level of a sacrificial material strip 42 includes a rectangular shape and a pair of "wing shapes" that have an areal overlap with overlying insulating strips 32 and/or underlying insulating strips 32. Each rectangular shape does not have any areal overlap with overlying insulating strips 32 and/or underlying insulating strips 32. Each horizontal cross-sectional view of a laterally-undulating via cavities 23 at a level of an insulating strip 32 includes only a rectangular shape. Each sacrificial pillar structure 22 can have a rectangular horizontal cross-sectional shape that is invariant with translation along a vertical direction.

Referring to FIGS. 8A and 8B, a dielectric fill material can be deposited within each of the laterally-undulating via cavities 23 by a conformal deposition process (such as low pressure chemical vapor deposition process) or a self-planarizing deposition process (such as spin coating). The dielectric fill material can include a planarizable dielectric material such as undoped silicate glass, a doped silicate glass, or flowable oxide (FOX). Excess portions of the dielectric fill material can be removed from above the horizontal plane including the top surfaces of the insulating cap strips 70. Each remaining portion of the dielectric fill material constitutes a dielectric pillar structure 24.

Each dielectric pillar structure 24 has a laterally-undulating vertical profile in vertical cross-sectional views in vertical planes that are perpendicular to the first horizontal direction hd1. Each horizontal cross-sectional view of a dielectric pillar structure 24 at a level of a sacrificial material strip 42 includes a rectangular shape and a pair of wing shapes that have an areal overlap with overlying insulating strips 32 and/or underlying insulating strips 32. Each rectangular shape does not have any areal overlap with overlying insulating strips 32 and/or underlying insulating strips 32. Each horizontal cross-sectional view of a dielectric pillar structure 24 at a level of an insulating strip 32 includes only a rectangular shape. A two-dimensional array of dielectric pillar structures 24 is formed. In one embodiment, each sacrificial pillar structure 22 can have a rectangular horizontal cross-sectional area. In one embodiment, a row of dielectric pillar structures 24 can be interlaced with a row of sacrificial pillar structures 22 within each line trench 49. A laterally alternating sequence of sacrificial pillar structures 22 and dielectric pillar structures 24 is formed within each line trench 49.

Referring to FIGS. 9A and 9B, the sacrificial pillar structures 22 can be removed selective to the dielectric pillar structures 24, the insulating strips 32, the insulating cap strips 70, the sacrificial material strips 42, and the insulating material layer 10. If the sacrificial pillar structure 22 includes amorphous silicon, a wet etch process using hot trimethyl-2 hydroxyethyl ammonium hydroxide ("hot TMY") or tetramethyl ammonium hydroxide (TMAH) may be used to remove the sacrificial pillar structures 22. A memory opening 25 is formed in each volume from which each sacrificial pillar structure 22 is removed. In one embodiment, each of the memory openings 25 can be a rectangular memory opening having a same horizontal rectangular cross-sectional area that is invariant with translation along the vertical direction.

A laterally alternating sequence of memory openings 25 and dielectric pillar structures 24 can be formed within each line trench 49. A two-dimensional array of memory openings 25 can be interlaced with a two-dimensional array of dielectric pillar structures 24. In one embodiment, the two-dimensional array of memory openings 25 can be a periodic two-dimensional array having a two-dimensional periodicity, and the two-dimensional array of dielectric pillar structures 24 can be a periodic two-dimensional array having the same two-dimensional periodicity as the periodic two-dimensional array of memory openings 25.

Figures 10A, 10B:
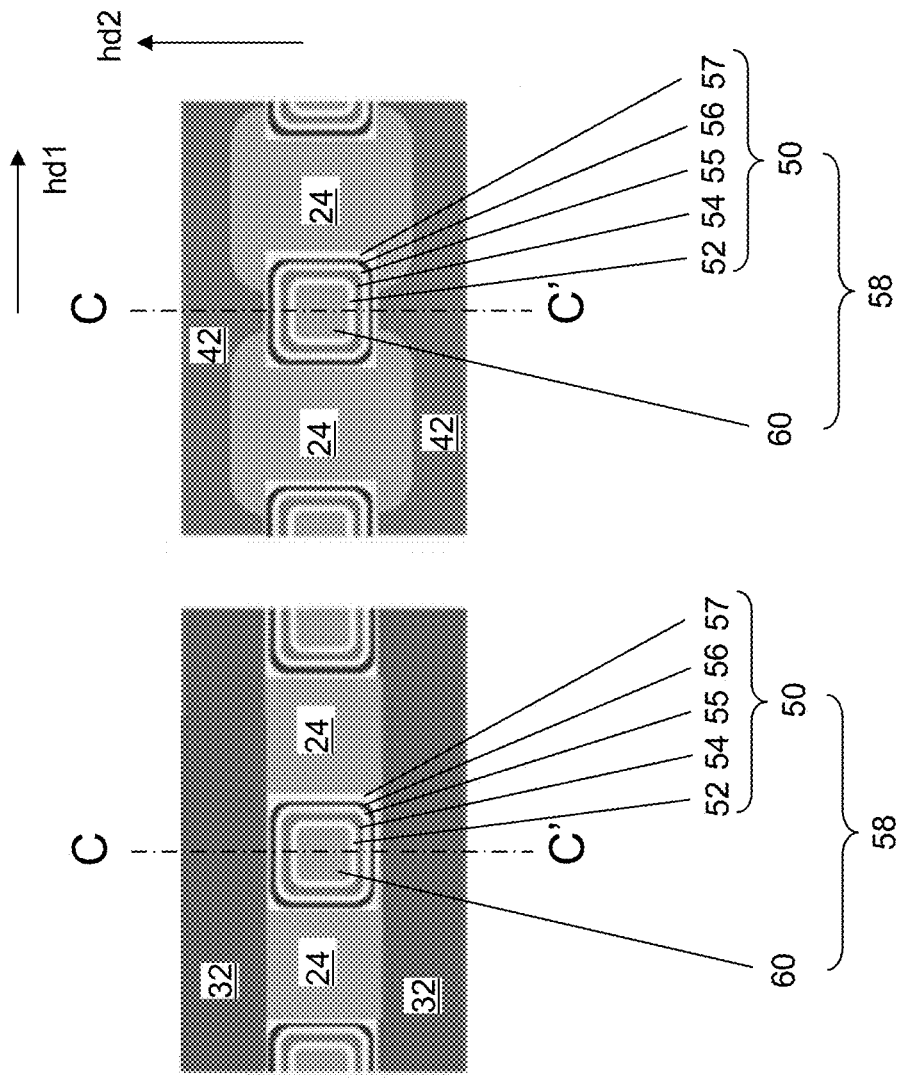
FIG. 10A is a first horizontal cross-sectional view of a region of the first exemplary structure after formation of memory opening fill structures rectangular memory openings by removal of the sacrificial pillar structures according to an embodiment of the present disclosure.
FIG. 10B is a second horizontal cross-sectional view of a region of the first exemplary structure after formation of memory opening fill structures rectangular memory openings by removal of the sacrificial pillar structures according to an embodiment of the present disclosure.
Figure 10C:
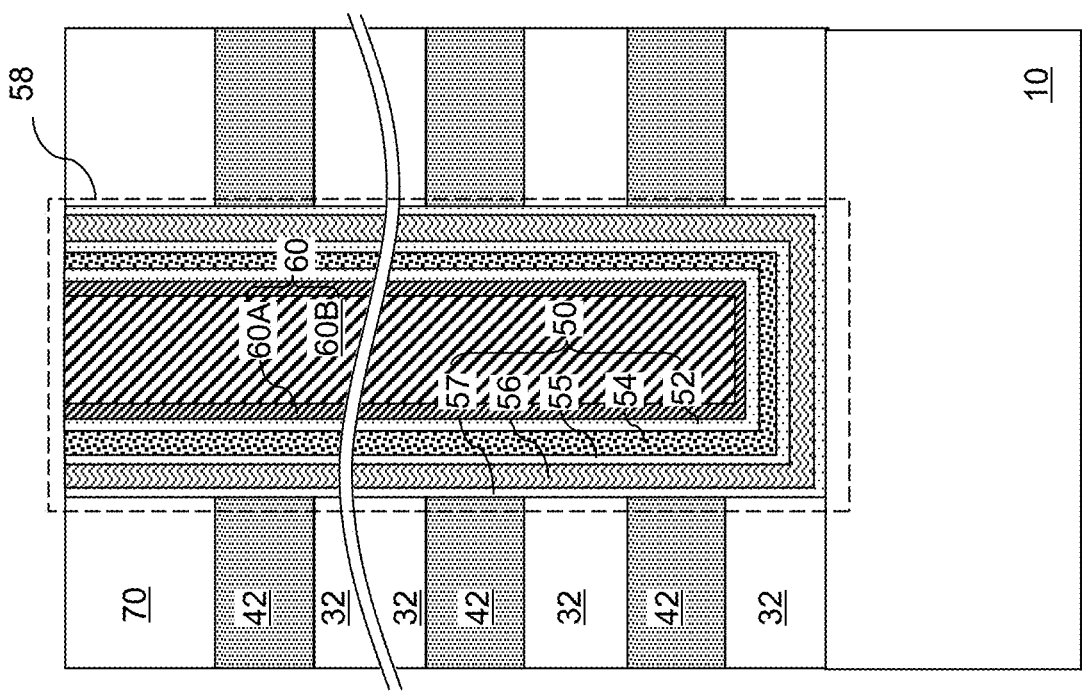
FIG. 10C is a vertical cross-sectional view of a region of the first exemplary structure along the vertical plane C-C' of FIGS. 10A and 10B.

Referring to FIGS. 10A-10C, continuous material layers can be sequentially deposited in the memory openings 25. The continuous material layers can include, for example, an optional selector-side spacer layer 57, a selector material layer 56, an optional intermediate spacer layer 55, a memory material layer 54, an optional memory-side spacer layer 52, and a vertical bit line 60. The set of the selector-side spacer layer 57, the selector material layer 56, the intermediate spacer layer 55, the memory material layer 54, and the memory-side spacer layer 52 constitutes a memory film 50.

In general, the memory material layer 54 can include any non-volatile memory material that can provide two distinct resistive states depending on the history of a bias voltage thereacross. In one embodiment, the memory material layer 54 can include a resistive memory material that can be employed in resistive random access memory devices. For example, the memory material layer 54 can include a transition metal oxide material that provides different resistive states through oxygen vacancy migration (such as hafnium oxide, tantalum oxide, tungsten oxide), a transition metal oxide material that functions as a reversible thermochemical fuse/antifuse (such as nickel oxide), an electrochemical migration-based programmable metallization material, which is also referred to as a conductive bridging material (such as copper-doped silicon dioxide glass, silver-doped germanium selenide, or silver-doped germanium sulfide), a Schottky barrier material or a tunnel barrier material (such as a memristor material, a barrier modulated cell/vacancy-modulated conductive oxide material (e.g., titanium oxide), or a praseodymium-calcium-manganese oxide (PCMO) material), a phase change memory material (such as a chalcogenide alloy, e.g., a germanium-antimony-telluride compound), a superlattice structure that exhibits multiple resistive states through interfacial effects (such as a superlattice of chalcogenide alloys), a tunneling magnetoresistance material (such as a layer stack of a CoFeB/MgO/CoFeB), or a Mott transition-based metal-insulator transition (MIT) switching device. The thickness of the memory material layer 54 may be suitably selected, and may be in a range from 2 nm to 50 nm, such as from 5 nm to 20 nm, although lesser and greater thicknesses can also be employed.

In one embodiment, the memory material layer 54 includes a resistive memory material. In one embodiment, the memory material layer 54 includes the phase change memory material. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state Exemplary phase change memory materials include, but are not limited to, germanium antimony telluride compounds such as Ge$_2$Sb$_2$Te$_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the phase change memory material layer can be in a range from 1 nm to 60 nm, such as from 10 nm to 50 nm and/or from 20 nm to 40 nm, although lesser and greater thicknesses can also be employed.

The selector material layer 56 includes a non-Ohmic material that provides electrical connection of electrical isolation depending on the magnitude and/or the polarity of an externally applied voltage bias thereacross. In one embodiment, the selector material layer 56 includes at least one threshold switch material layer. The at least one threshold switch material layer includes any suitable threshold switch material which exhibits non-linear electrical behavior, such as an ovonic threshold switch material or volatile conductive bridge. In another embodiment, the selector material layer 56 includes at least one non-threshold switch material layer, such as a tunneling selector material or diode materials (e.g., materials for p-n semiconductor diode, p-i-n semiconductor diode, Schottky diode or metal-insulator-metal diode). As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is lowered below a critical holding voltage. Throughout the resistive state changes, the ovonic threshold switch material can remain non-crystalline (e.g., amorphous). In one embodiment, the ovonic threshold switch material can comprise a chalcogenide material which exhibits hysteresis in both the write and read current polarities. The chalcogenide material may be a GeTe compound or a Ge—Se compound doped with a dopant selected from As, N, and C, such as a Ge—Se—As compound semiconductor5 material. The ovonic threshold switch material layer can include a selector material layer 56 which contains any ovonic threshold switch material. In one embodiment, the selector material layer 56 can include, and/or can consist essentially of, a GeSeAs alloy, a GeTeAs, a GeSeTeSe alloy, a GeSe alloy, a SeAs alloy, a GeTe alloy, or a SiTe alloy.

In one embodiment, the material of the selector material layer 56 can be selected such that the resistivity of the selector material layer 56 decreases at least by two orders of magnitude (i.e., by more than a factor of 100) upon application of an external bias voltage that exceeds a critical bias voltage magnitude (also referred to as threshold voltage). In one embodiment, the composition and the thickness of the selector material layer 56 can be selected such that the critical bias voltage magnitude can be in a range from 1 V to 6 V, although lesser and greater voltages can also be employed for the critical bias voltage magnitude. The thickness of the selector material layer 56 can be, for example, in a range from 1 nm to 50 nm, such as from 5 nm to 25 nm, although lesser and greater thicknesses can also be employed.

Each of the selector-side spacer layer 57, the intermediate spacer layer 55, and the memory-side spacer layer 52 is optional, and can include a material that can control conduction of electrical current thereacross at a suitable level. For example, each of the selector-side spacer layer 57, the intermediate spacer layer 55, and the memory-side spacer layer 52 can independently include any material selected from a conductive metallic nitride such as titanium nitride, tungsten or tungsten nitride, a conductive metallic carbide, selenium, tellurium, doped silicon, germanium, an elemental metal such as silver, copper, or aluminum, amorphous carbon or diamondlike carbon (DLC), carbon nitride, an intermetallic alloy or an alloy of at least one metallic element and at least one non-metallic element, an alloy of any of the preceding materials, and/or a layer stack including a plurality of the preceding materials. Some of the above materials, such as carbon, may also function as a thermally insulating material. Each of the selector-side spacer layer 57, the intermediate spacer layer 55, and the memory-side spacer layer 52 can have a thickness in a range from 1 nm to 30 nm, such as from 3 nm to 10 nm, although lesser and greater thicknesses can be employed for each of the selector-side spacer layer 57, the intermediate spacer layer 55, and the memory-side spacer layer 52.

The vertical bit line 60 includes at least one conductive material, which can comprise at least one metallic material or at least one heavily doped (conductive) semiconductor material. For example, the vertical bit line 60 can include a metallic nitride liner 60A including a metallic nitride material (such as TiN, TaN, or WN) and a metallic fill material portion 60B including a metallic fill material (such as W, Cu, Co, Ru, or Mo).

A planarization process can be performed to remove portions of the various material layers from above the horizontal plane including the top surface of the insulating cap strips 70. The planarization process can include, for example, a recess etch process that indiscriminately etches the various material layers of the memory film 50 and the vertical bit line 60. Remaining material portions of the memory film 50 and the vertical bit line 60 within each memory openings 25 can have top surfaces within the horizontal plane including the top surface of the insulating cap strips 70. The set of all material portions that fills a memory opening 25 is herein referred to as a memory opening fill structure 58, which can include a memory film 50 and a vertical bit line 60.

Generally, laterally alternating sequences of memory opening fill structures 58 and dielectric pillar structures 24 are formed within the line trenches 49. Each of the memory opening fill structures 58 comprises a respective vertical bit line 60. A memory material portion (such as a respective portion of the memory material layer 54) is formed between each laterally neighboring pair of a sacrificial material strip 42 and a vertical bit line 60. A lateral extent of an overlap between the memory material portion (such as a respective portion of the memory material layer 54) and a most proximal one of the sacrificial material strips 42 along the first horizontal direction hd1 can be the same as the dimension along the first horizontal direction hd1 of a tip portion of the sacrificial material strip 42 that contacts the memory film 50 (such as the selector-side spacer layer 57). As such, the lateral extent of an overlap between the memory material portion and a most proximal one of the sacrificial material strips 42 along the first horizontal direction hd1 can be less than a lateral extent of the most proximal one of the memory opening fill structures 58 along the first horizontal direction hd1.

Figure 11A:
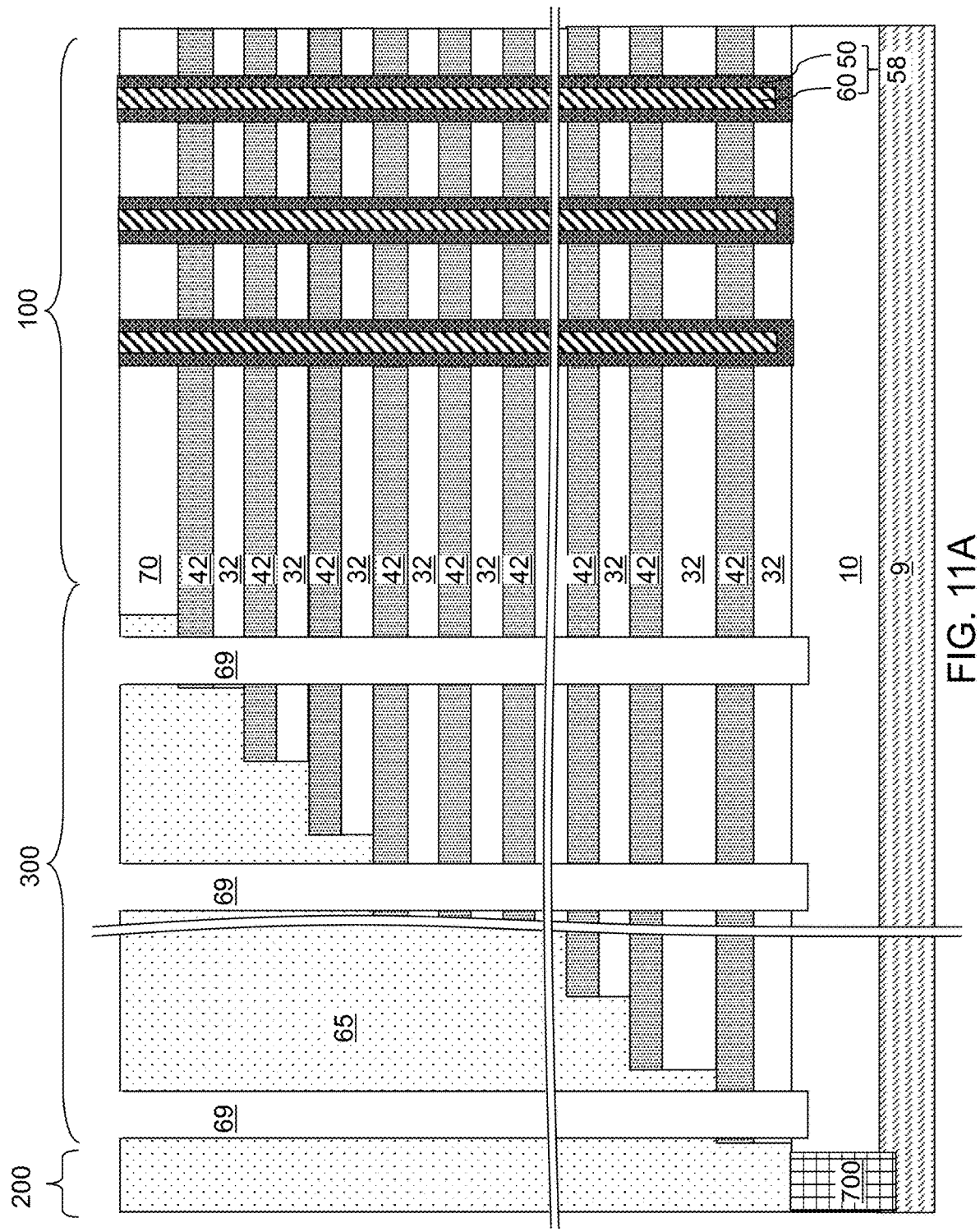
FIG. 11A is a schematic vertical cross-sectional view of the first exemplary structure after formation of backside openings according to an embodiment of the present disclosure.
Figure 11B:
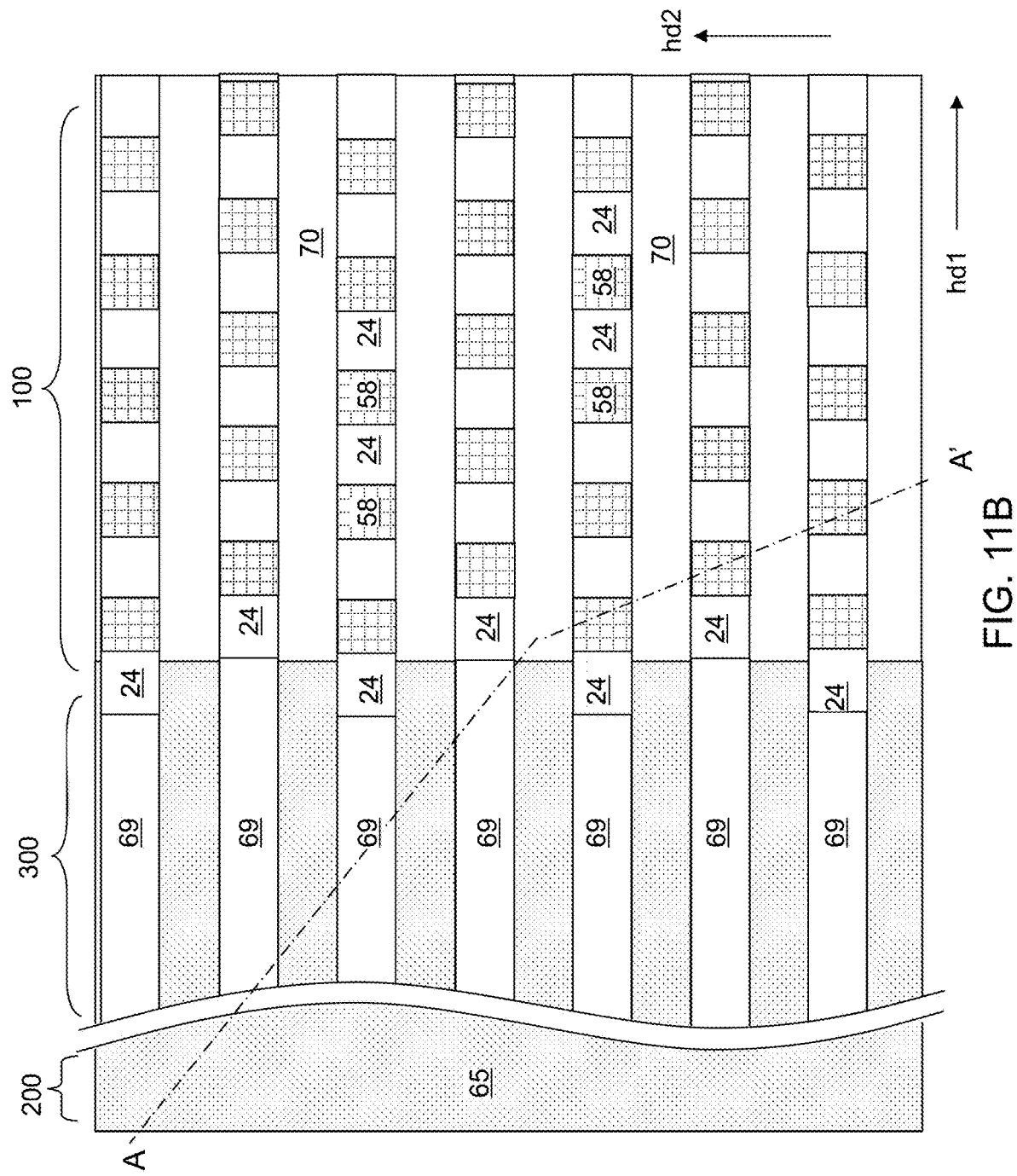
FIG. 11B is a partial see-through top-down view of the first exemplary structure of FIG. 11A. The vertical plane A-A' is the plane of the schematic vertical cross-sectional view of FIG. 11A.

Referring to FIGS. 11A and 11B, backside cavities 69 are formed in portions of the line trenches 49 located in the staircase region 300. In one embodiment, portions of the line trenches 49 may be filled with the same dielectric fill material as the dielectric pillar structures 24, and can be removed by a combination of lithographic patterning and an anisotropic etch process. Alternatively, the sacrificial fill material of the sacrificial rail structures 22R can be protected in the staircase region by a patterned etch mask layer that covers the staircase region during etch processes that remove the material of the sacrificial rail structures 22R. Remaining portions of the sacrificial rail structures 22R can be removed after formation of the memory opening fill structures 58 to form the backside cavities 69. Optionally, additional backside cavities may be formed within the memory array region 100 within areas from which material portions filling the line trenches 49 are removed. Such material portions that are removed to form the additional backside trenches may include remaining portions of the sacrificial rail structures 22R or dielectric material portions having the same material composition as the dielectric pillar structures 24. Sidewalls of each layer within the vertically alternating stacks (32, 42) can be physically exposed around the backside cavities 69. Optionally, a top surface of the insulating material layer 10 may be physically exposed at the bottom of each backside cavity 69.

Figure 12A:
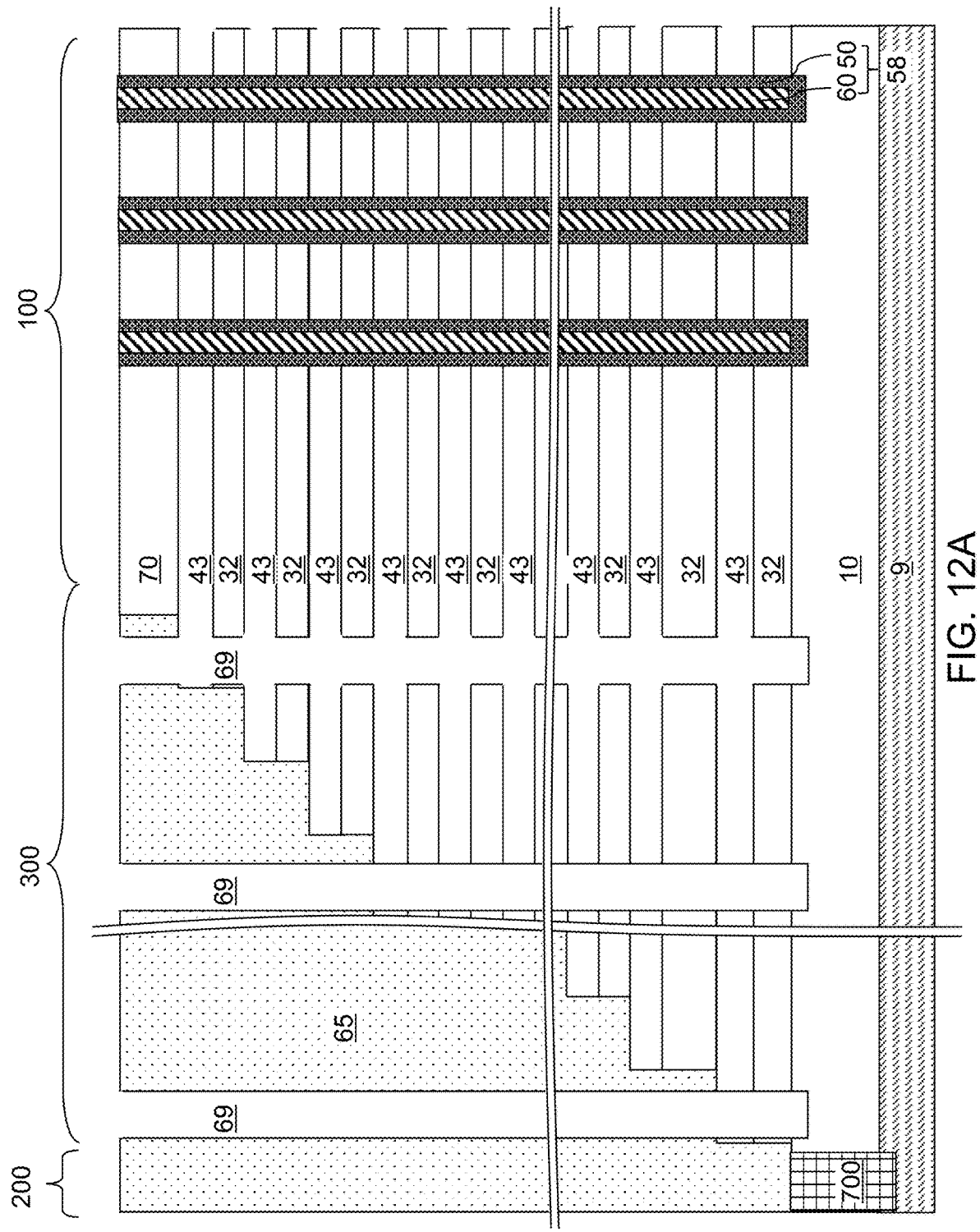
FIG. 12A is a schematic vertical cross-sectional view of the first exemplary structure after formation of backside recesses according to an embodiment of the present disclosure.
Figure 12B:
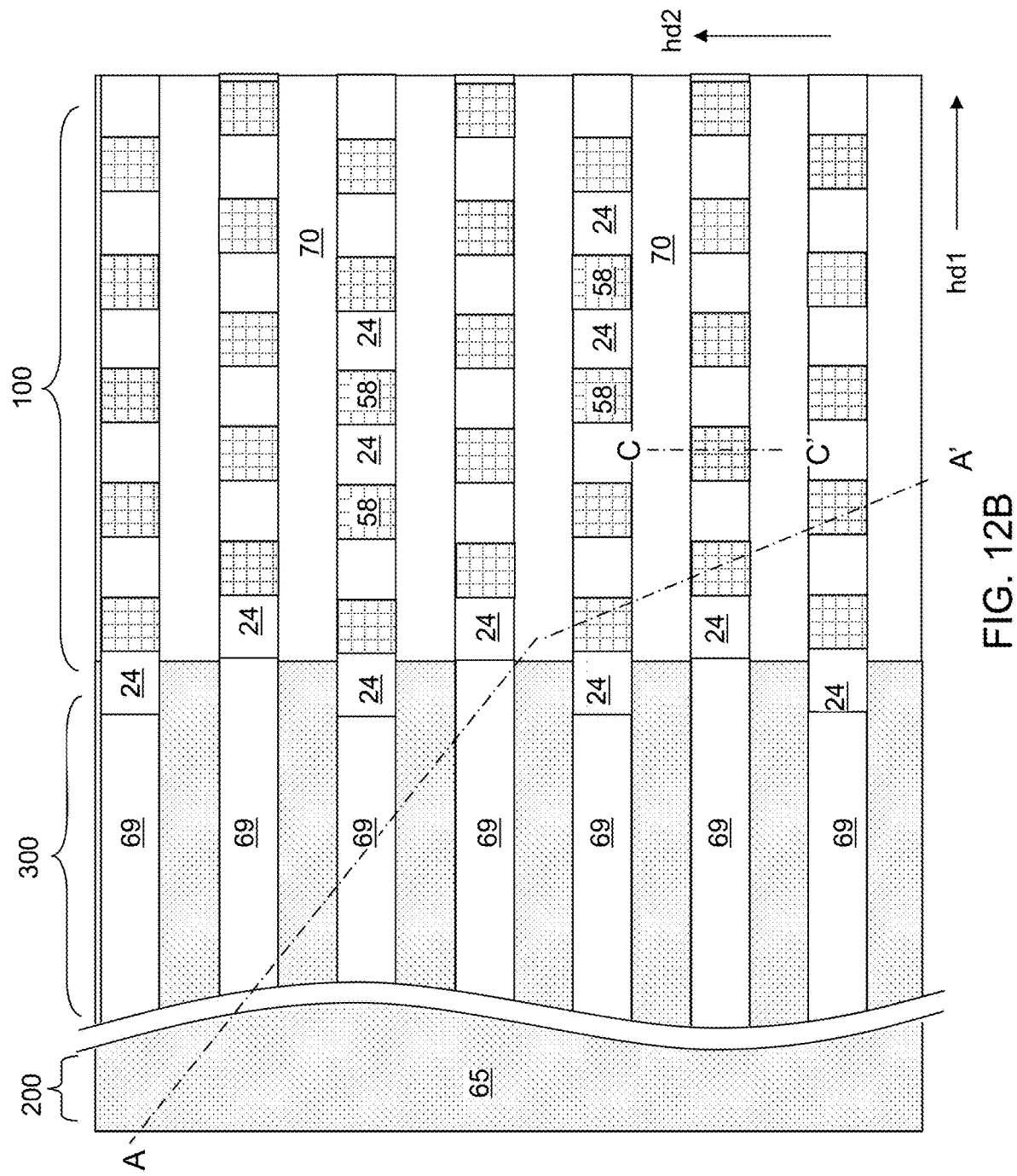
FIG. 12B is a partial see-through top-down view of the first exemplary structure of FIG. 12A. The vertical plane A-A' is the plane of the schematic vertical cross-sectional view of FIG. 12A.
Figure 12C:
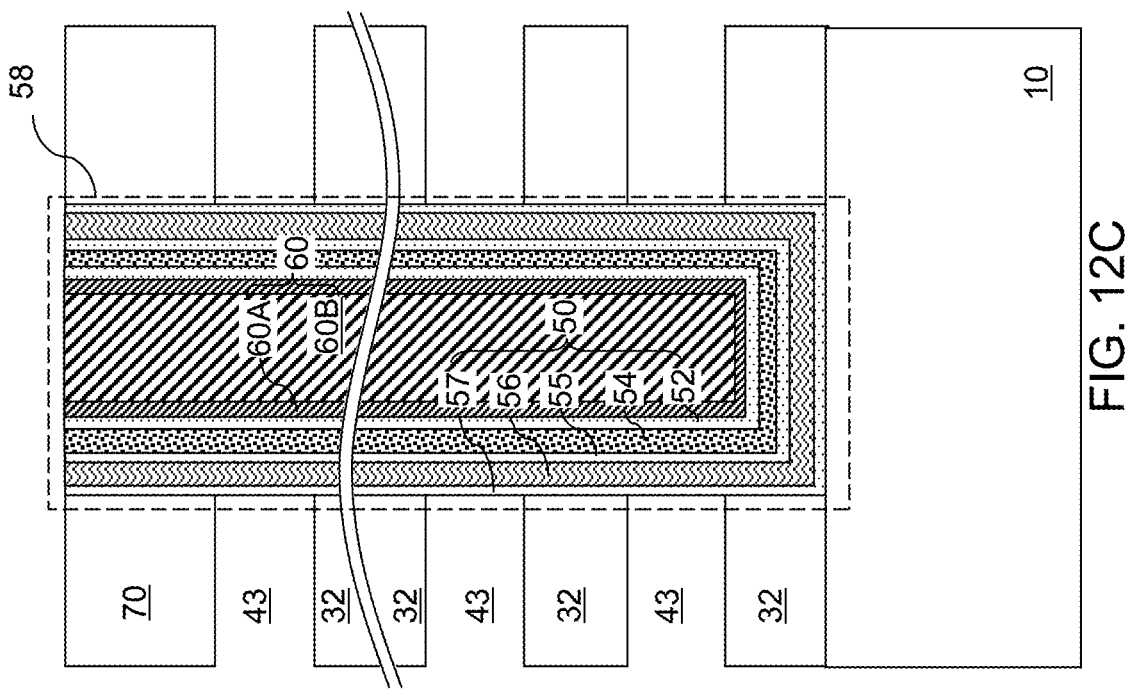
FIG. 12C is a vertical cross-sectional view of the first exemplary structure along the vertical plane C-C' of FIG. 12B.
Figure 13D:
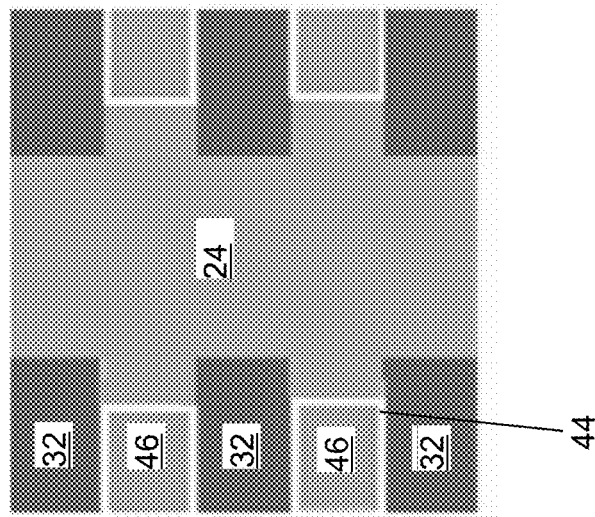
FIG. 13D is a vertical cross-sectional view of the first exemplary structure along the vertical plane D-D' of FIGS. 13A and 13B.
Figure 13C:
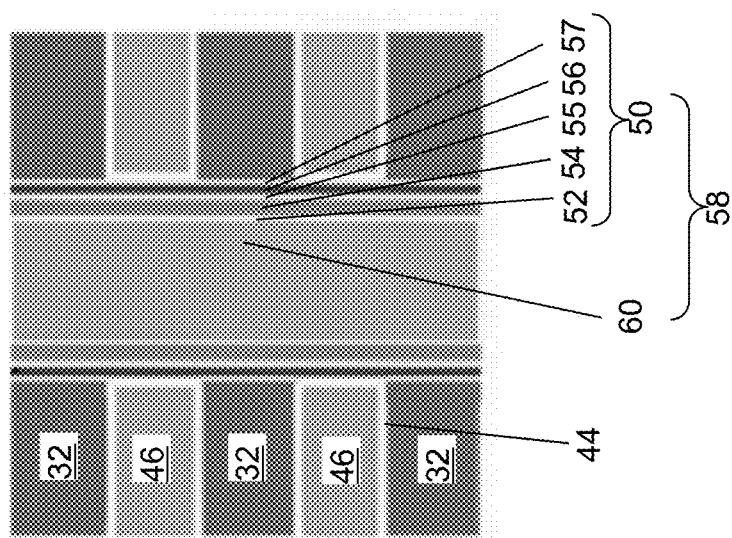
FIG. 13C is a vertical cross-sectional view of the first exemplary structure along the vertical plane C-C' of FIGS. 13A and 13B.
Figure 13E:
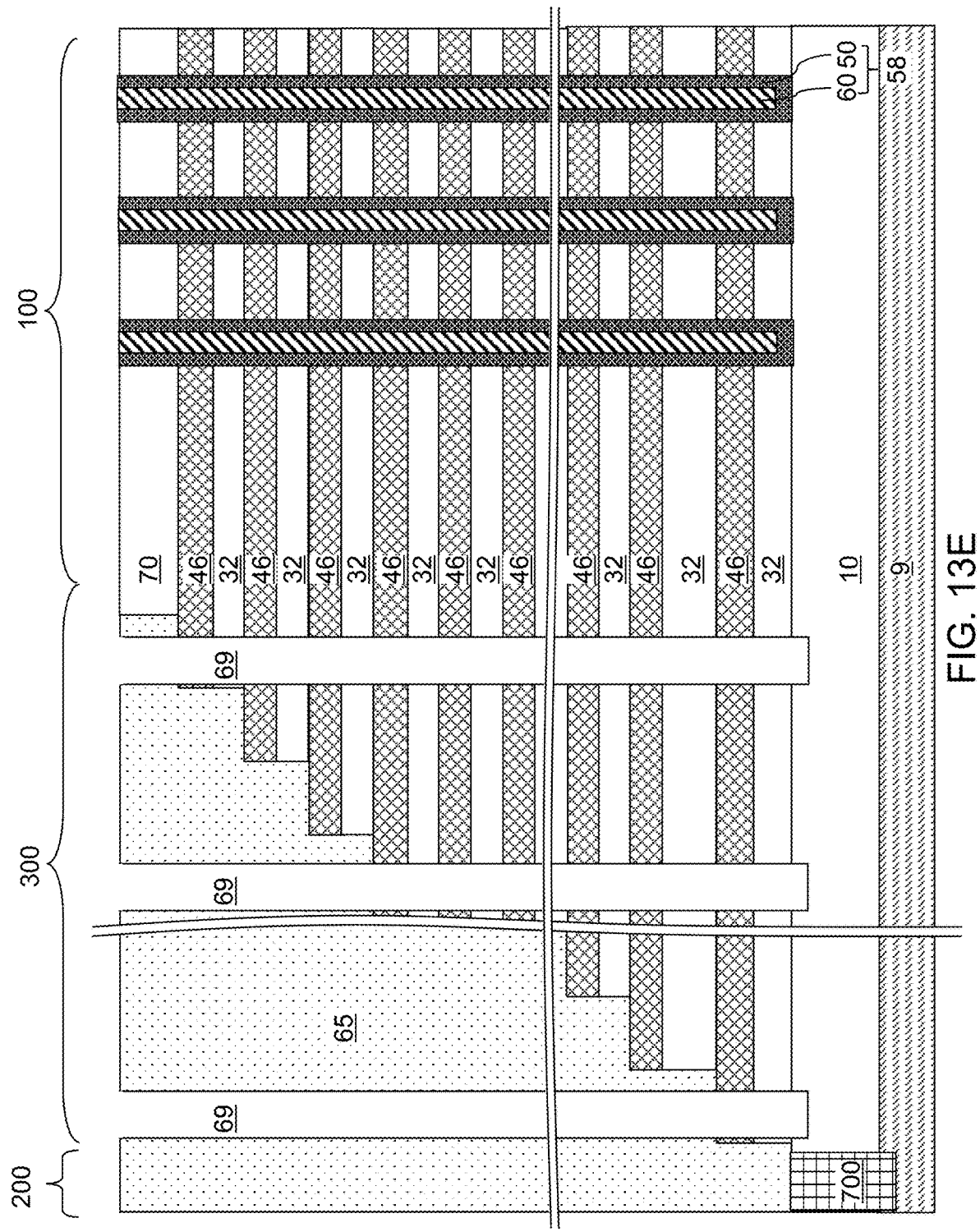
FIG. 13E is a vertical cross-sectional view of the first exemplary structure of FIGS. 13A-13D.
Figure 13F:
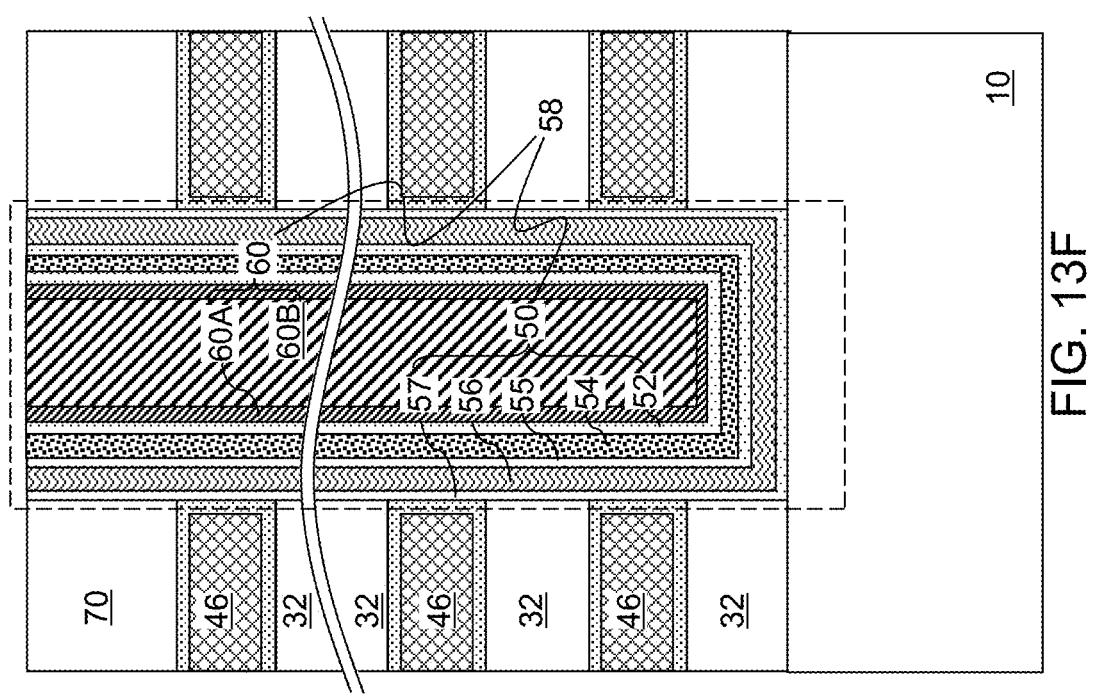
FIG. 13F is a vertical cross-sectional view of the first exemplary structure of FIGS. 13A-13E.

Referring to FIGS. 12A-12C, backside recesses 43 are formed in volumes from which the sacrificial material strips 42 are removed. The removal of the second material of the sacrificial material strips 42 can be selective to the first material of the insulating strips 32, the material of the retro-stepped dielectric material portion 65, the insulating material layer 10, and the material of the outermost material portions of the memory opening fill structures 58. In case the sacrificial material strips 42 include silicon nitride, a wet etch process employing hot phosphoric acid can be employed to form the backside recesses 43.

For example, the isotropic etch process employed to form the backside recesses 43 can employ an etch chemistry that is selective to the material of the selector-side spacer layer 57. Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material strips 42 is removed. The memory openings in which the memory opening fill structures 58 are formed are herein referred to as front side openings or front side cavities in contrast with the backside recesses 43. In one embodiment, each backside recess 43 can define a space for receiving a respective word line of a three-dimensional memory device.

Each of the plurality of backside recesses 43 can extend substantially parallel to the top surface of the substrate 9. A backside recess 43 can be vertically bounded by a top surface of an underlying insulating strip 32 and a bottom surface of an overlying insulating strip 32. In one embodiment, each backside recess 43 can have a uniform height throughout.

Referring to FIGS. 13A-13F, a barrier layer 44 can be optionally formed. The barrier layer 44, if present, comprises a conductive material, a semiconducting material, or a dielectric material that limits the electrical current through a neighboring memory material portion. The barrier layer 44 can be formed in the backside recesses 43 and on a sidewall of the backside cavity 69. The barrier layer 44 can be formed directly on horizontal surfaces of the insulating strips 32 and sidewalls of the memory opening fill structures 58 within the backside recesses 43. In one embodiment, the barrier layer 44 can be formed by a conformal deposition process such as atomic layer deposition (ALD). The barrier layer 44 can include a material selected from a conductive metallic nitride such as titanium nitride, tungsten or tungsten nitride, a conductive metallic carbide, selenium, tellurium, doped silicon, germanium, an elemental metal such as silver, copper, or aluminum, amorphous carbon or diamondlike carbon (DLC), carbon nitride, an intermetallic alloy or an alloy of at least one metallic element and at least one non-metallic element, an alloy of any of the preceding materials, and/or a layer stack including a plurality of the preceding materials. The thickness of the barrier layer 44 can be in a range from 1 nm to 15 nm, such as 2 to 6 nm, although lesser and greater thicknesses can also be employed.

At least one metallic material can be subsequently deposited in remaining volumes of the backside recesses 43. The at least one metallic material can include a metallic barrier layer and a metallic fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be subsequently deposited in remaining volumes of the plurality of backside recesses 43, on the sidewalls of the at least one the backside cavity 69, and over the top surface of the insulating cap strips 70 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating strips 32 and the memory opening fill structures 58 by the metallic barrier layer, which is a metallic barrier layer that blocks diffusion of fluorine atoms therethrough.

A plurality of electrically conductive strips 46 can be formed in the plurality of backside recesses 43, and a continuous electrically conductive material strip can be formed on the sidewalls of each backside cavity 69 and over the insulating cap strips 70. Each electrically conductive strip 46 includes a portion of the metallic barrier layer and a portion of the metallic fill material layer that are located between a vertically neighboring pair of dielectric material layers such as a pair of insulating strips 32. The continuous electrically conductive material strip includes a continuous portion of the metallic barrier layer and a continuous portion of the metallic fill material layer that are located in the backside cavities 69 or above the insulating cap strips 70. Each sacrificial material strip 42 can be replaced with an electrically conductive strip 46. An elongated void is present in the portion of each backside cavity 69 that is not filled with the barrier layer 44 and the continuous electrically conductive material strip.

The deposited metallic material of the continuous electrically conductive material strip is etched back from the sidewalls of each backside cavity 69 and from above the insulating cap strips 70, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be a conductive line structure. Thus, the sacrificial material strips 42 are replaced with the electrically conductive strips 46.

Each electrically conductive strip 46 can function as a word line. In other words, each electrically conductive strip 46 can be a word line that functions as a common electrode for the plurality of vertical memory devices.

In one embodiment, the removal of the continuous electrically conductive material strip can be selective to the material of the barrier layer 44. In this case, a horizontal portion of the barrier layer 44 can be present at the bottom of each backside cavity 69. In another embodiment, the removal of the continuous electrically conductive material strip may not be selective to the material of the barrier layer 44 or, the barrier layer 44 may not be employed.

The electrically conductive strips 46 can be formed with serration such that a serrated portion (i.e., a protruding portion) laterally extends toward each neighboring memory opening fill structure 58. The width of the areal overlap between a vertical sidewall of a serrated portion of an electrically conductive strip 46 and a neighboring memory opening fill structure 58 is the same as the width of the vertical sidewall of the serrated portion of the electrically conductive strip 46, and is less than the lateral dimension of the neighboring memory opening fill structure 58 along the first horizontal direction hd1. In one embodiment, each electrically conductive strip 46 can comprise a pair of laterally undulating sidewalls that provides the feature of serration. Each memory material portion can be formed as a memory material layer 54 within a respective one of the rectangular memory openings 25.

In one embodiment, the center portion of the dielectric pillar structure 24 has a first lengthwise lateral extent LLE1 (i.e., a lateral distance between neighboring pairs of memory opening fill structures 58 in a line trench 49) along the first horizontal direction hd1, and each laterally protruding portion within the two vertical stacks of laterally protruding portions of the dielectric pillar structures 24 has a second lengthwise lateral extent LLE2 along the first horizontal direction that is greater than the first lengthwise lateral extent LLE1.

Figure 14A:
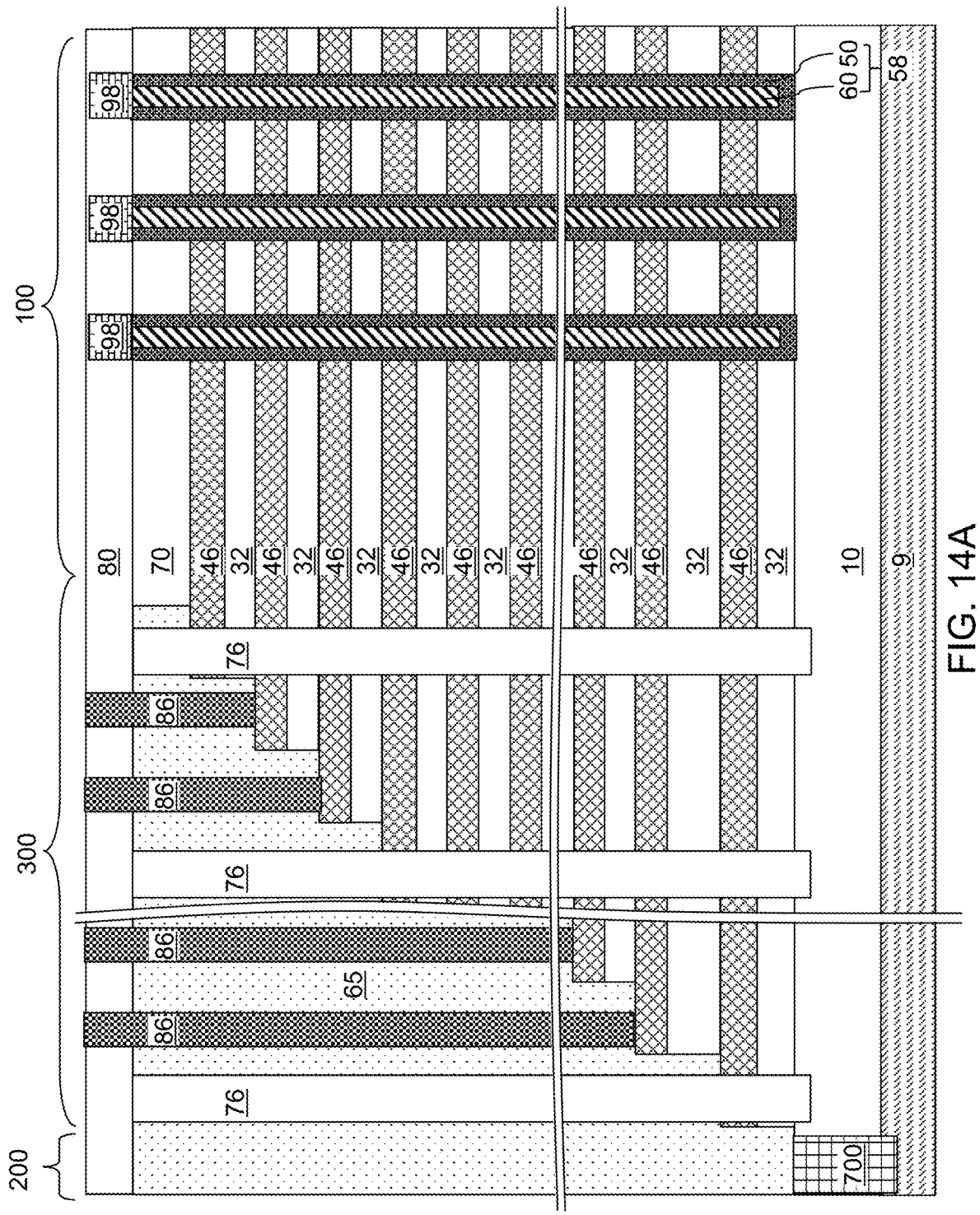
FIG. 14A is a schematic vertical cross-sectional view of the exemplary structure after formation of backside dielectric fill structures and bit lines according to an embodiment of the present disclosure.
Figure 14B:
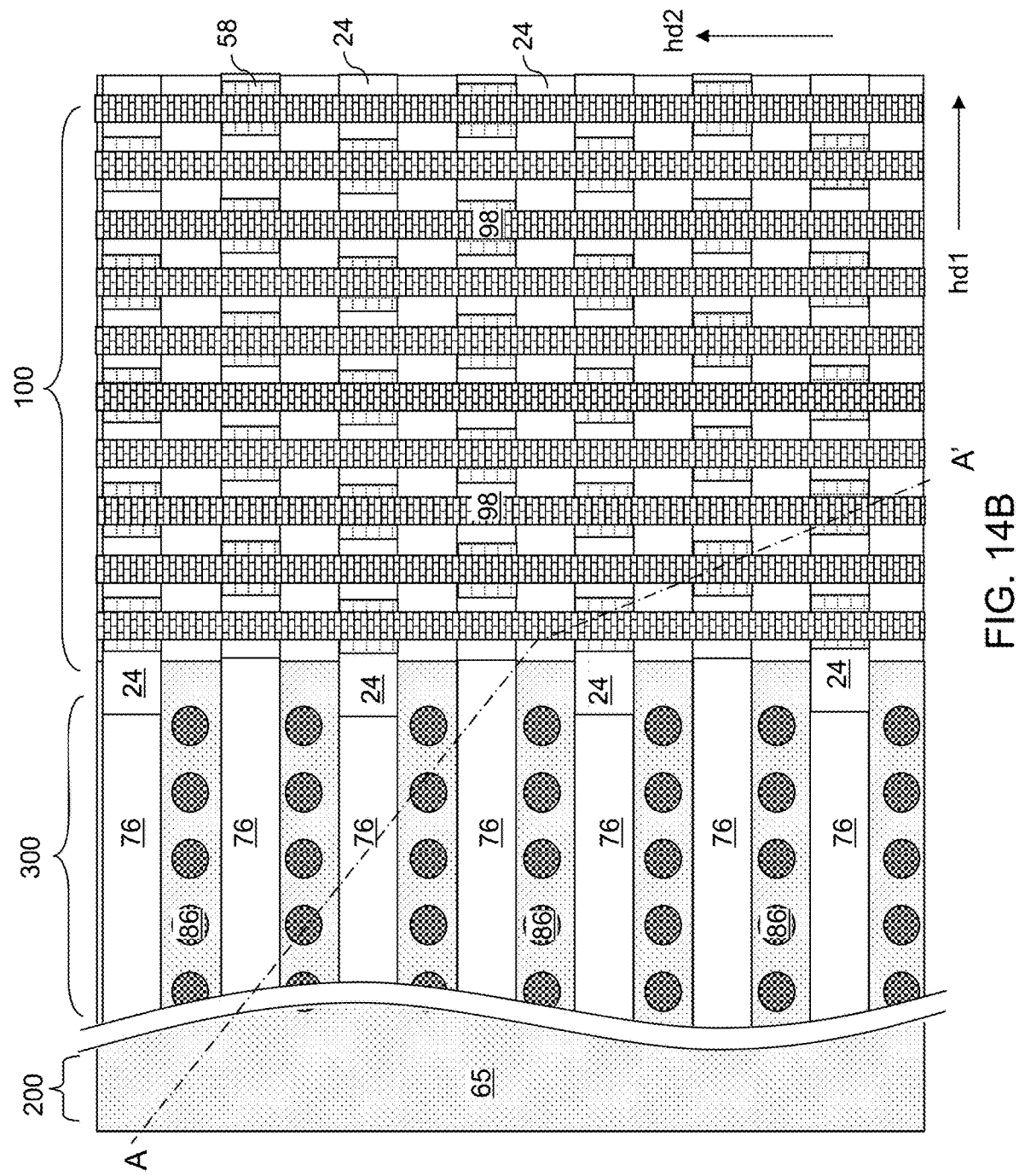
FIG. 14B is a partial see-through top-down view of the exemplary structure of FIG. 14A. The vertical plane A-A' is the plane of the schematic vertical cross-sectional view of FIG. 14A.

Referring to FIGS. 14A and 14B, an insulating material layer can be formed in the backside cavities 69 and over the insulating cap strips 70 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The horizontal portion of the insulating material layer overlying the insulating cap strips 70 constitute a contact-level dielectric layer 80. Each portion of the insulating material layer in the backside cavities 69 constitutes a backside dielectric fill structure 76.

Line trenches laterally extending along the second horizontal direction hd2 can be formed through the contact-level dielectric layer in areas that overlie the vertical bit lines 60. At least one conductive material can be deposited in the line trenches to form horizontally extending conductive lines, which are herein referred to as global bit lines 98. The global bit lines 98 can laterally extend along the second horizontal direction hd2, and can contact a respective subset of the vertical bit lines 60. In an illustrative example, each global bit line 98 can contact a set of vertical bit line 60 that are located in every other line trench 49 and aligned along the second horizontal direction hd2.

Word line contact via structures 86 can be formed on the electrically conductive layers 46 through the contact level dielectric layer 80, and through the retro-stepped dielectric material portion 65. The word line contact via structures 86 provide electrical contact to each of the electrically conductive lines 46, which can function as word lines.

Referring to FIGS. 15A and 15B, a second exemplary structure according to a second embodiment of the present disclosure is illustrated, which can be the same as the first exemplary structure illustrated in FIGS. 8A and 8B.

Referring to FIGS. 16A and 16B, the processing steps of FIGS. 9A and 9B can be performed on the second exemplary structure. Specifically, rectangular memory openings 25 can be formed by removing the sacrificial pillar structures 22 selective to the dielectric pillar structures 24, the insulating strips 32, and the sacrificial material strips 42. The second exemplary structure at this processing step can be the same as the first exemplary structure at the processing step of FIGS. 9A and 9B.

Figure 17A:
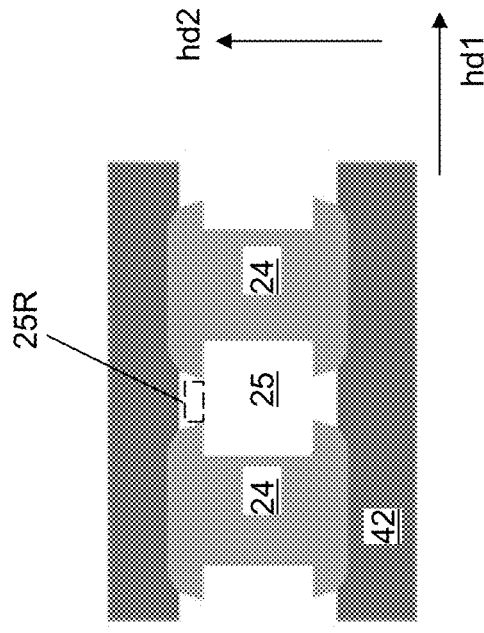
FIG. 17A is a first horizontal cross-sectional view of a region of the second exemplary structure after formation of lateral recesses according to an embodiment of the present disclosure.
Figure 17B:
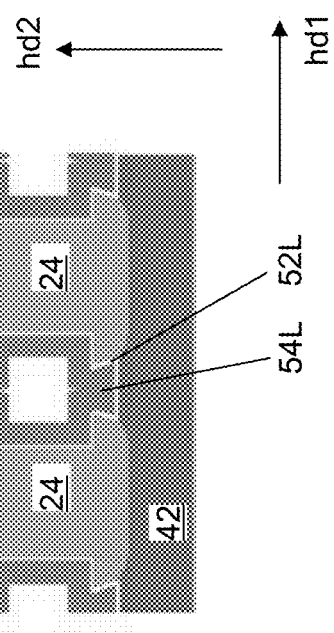
FIG. 17B is a second first horizontal cross-sectional view of a region of the second exemplary structure after formation of lateral recesses according to an embodiment of the present disclosure.

Referring to FIGS. 17A and 17B, surface portions of the sacrificial material strips 42 can be laterally recessed around each memory opening 25. Each memory opening 25 can be laterally expanded at each level of the sacrificial material strips 42 to include two vertical stacks of lateral recesses 25R. Each lateral recess 25R has an areal overlap with an underlying insulating strip 32 and with an overlying insulating strip 32 and/or an overlying insulating cap strip 70. The surface portions of the sacrificial material strips 42 can be laterally recessed by an isotropic etch process that etches the material of the sacrificial material strips 42 selective to the materials of the insulating strips 32, the insulating cap strips 70, the dielectric pillar structures 24, and the insulating material layer 10. For example, if the sacrificial material strips 42 include silicon nitride, a wet etch process employing hot phosphoric acid, a mixture of hydrofluoric acid and glycerol at an elevated temperature, or a mixture of ethylene glycol, acetic acid, nitric acid, and ammonium fluoride at an elevated temperature may be employed to laterally recess the sacrificial material strips 42 selective to the insulating strips 32, the insulating cap strips 70, and the sacrificial pillar structures 22.

The lateral recess distance of the isotropic etch process at this processing step may be less than the lateral etch distance of the isotropic etch process at the processing steps of FIGS. 7A and 7B. In this case, the width of each physically exposed sidewall of the sacrificial material strips 42 that borders a respective lateral recess 25R can be less than the maximum lateral dimension of the memory opening 25 that the respective lateral recess 25R belongs to. In one embodiment, the lateral recess distance of the isotropic etch process at this processing step may be in a range from 5 nm to 200 nm, such as from 10 nm to 100 nm, although lesser and greater lateral etch distances can also be employed.

Figure 18A:
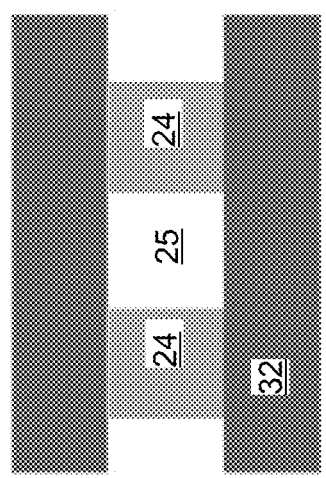
FIG. 18A is a first horizontal cross-sectional view of a region of the second exemplary structure after deposition of a memory material layer according to an embodiment of the present disclosure.
Figure 18B:
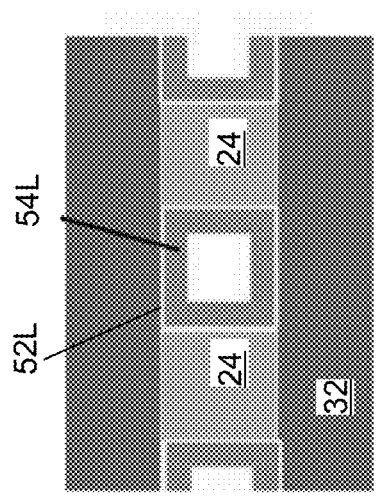
FIG. 18B is a second first horizontal cross-sectional view of a region of the second exemplary structure after deposition of the memory material layer according to an embodiment of the present disclosure.

Referring to FIGS. 18A and 18B, an optional continuous memory-side spacer layer 52L and a continuous memory material layer 54L can be formed by conformal deposition processes. The continuous memory-side spacer layer 52L can have the same material composition as, and the same thickness as, the memory-side spacer layer 52 described above. The continuous memory material layer 54L can have the same material composition as the memory material layer 54. The thickness of the continuous memory material layer 54L can be selected such that the entire volume of each lateral recess 25R of the memory openings 25 is filled within the combination of the continuous memory-side spacer layer 52L and the continuous memory material layer 54L. Each of the continuous memory-side spacer layer 52L and the continuous memory material layer 54L can be formed as a respective single continuous layer that extends over the insulating cap strips 70 and extends into each of the memory openings 25.

Figure 19A:
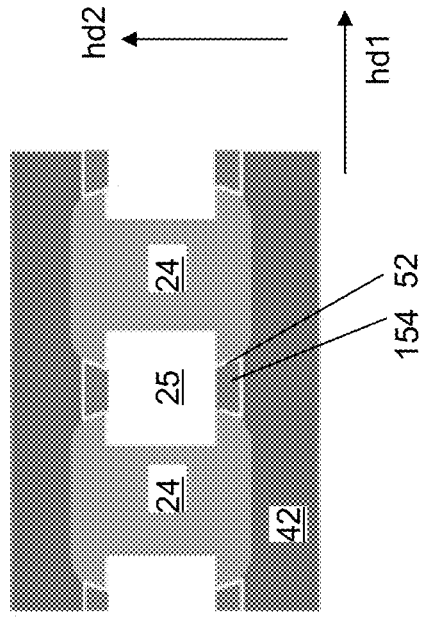
FIG. 19A is a first horizontal cross-sectional view of a region of the second exemplary structure after formation of memory material portions according to an embodiment of the present disclosure.
Figure 19B:
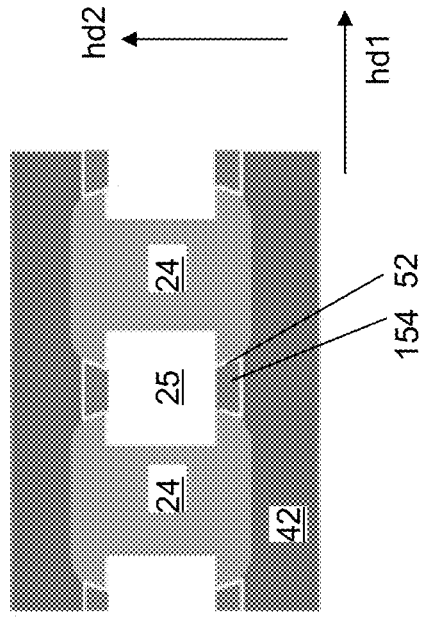
FIG. 19B is a second first horizontal cross-sectional view of a region of the second exemplary structure after formation of memory material portions according to an embodiment of the present disclosure.

Referring to FIGS. 19A and 19B, an anisotropic etch process can be performed to remove portions of the continuous memory-side spacer layer 52L and the continuous memory material layer 54L that are not masked by an overlying material portion (which can be an insulating cap strip 70 or an insulating strip 32). The continuous memory-side spacer layer 52L is divided into a plurality of memory-side spacer layers 52 located within a respective one of the lateral recesses 25R. The continuous memory material layer 54L is divided into a plurality of memory material portions 154. Each memory material potion 154 is a memory material portion that is formed in a respective one of the lateral recesses 25R.

Figure 20A:
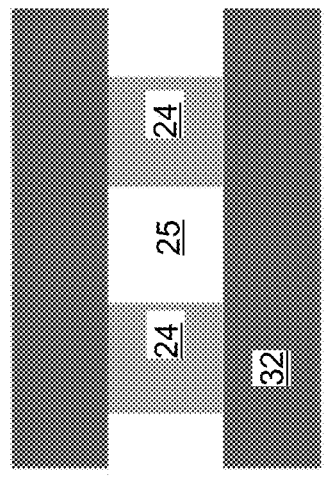
FIG. 20A is a first horizontal cross-sectional view of a region of the second exemplary structure after formation of memory opening fill structures according to an embodiment of the present disclosure.
Figure 20B:
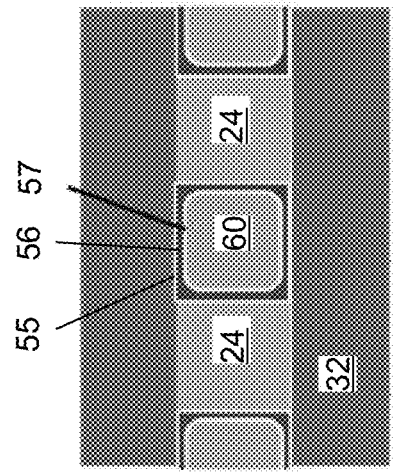
FIG. 20B is a second first horizontal cross-sectional view of a region of the second exemplary structure after formation of memory opening fill structures according to an embodiment of the present disclosure.

Referring to FIGS. 20A and 20B, an intermediate spacer layer 55, a selector material layer 56, and a selector-side spacer layer 57 can be sequentially formed at a periphery of the unfilled volume of each memory opening 25. Each of the intermediate spacer layer 55, the selector material layer 56, and the selector-side spacer layer 57 can have the same thickness as, and the same material composition as, the in the first exemplary structure of the first embodiment. At least one conductive material can be deposited within each remaining volume of the memory openings 25 on the inner sidewalls of the selector-side spacer layer 57 (or on the inner sidewalls of the selector material layer 56 in case the selector-side spacer layer 57 is omitted). Portions of the at least one conductive material, the intermediate spacer layer 55, the selector material layer 56, and the selector-side spacer layer 57 that overlie the horizontal plane including the top surfaces of the insulating cap strips 70 can be removed by a planarization process. Each remaining portion of the at least one conductive material constitutes a vertical bit line 60.

Each contiguous combination of a memory-side spacer layer 52, a memory material portion 154, an intermediate spacer layer 55, a selector material layer 56, and a selector-side spacer layer 57 constitutes a memory film 50. The set of all material portions that fills a memory opening 25 is herein referred to as a memory opening fill structure 58, which can include a memory film 50 and a vertical bit line 60. Each memory opening fill structure 58 can have a first lateral extent LE1 along the first horizontal direction hd1. Each memory material portion 154 can have a second lateral extent LE2 along the first horizontal direction hd1 that is less than first lateral extent LE1.

Laterally alternating sequences of memory opening fill structures 58 and dielectric pillar structures 24 are formed within the line trenches 49. Each of the memory opening fill structures 58 comprises a respective vertical bit line 60. A memory material portion 154 is formed between each laterally neighboring pair of a sacrificial material strip 42 and a vertical bit line 60. A lateral extent of an overlap between the memory material portion and a most proximal one of the sacrificial material strips 42 along the first horizontal direction hd1 (which can be the second lateral extend LE2) is less than a lateral extent of the most proximal one of the memory opening fill structures 58 along the first horizontal direction hd1 (which can be the first lateral extend LE1). A selector material portion comprising a portion of a selector material layer 56 may be located between each laterally neighboring pair of a sacrificial material strip 42 and a vertical bit line 60.

Referring to FIGS. 21A-21D, the processing steps of FIGS. 11A and 11B, 12A-12C, and 13A-13F can be subsequently performed to replace each sacrificial material strip 42 within an electrically conductive strip 46 or a combination of a portion of a barrier layer 44 and an electrically conductive strip 46.

In one embodiment, the center portion of the dielectric pillar structure 24 has a first lengthwise lateral extent LLE1 (i.e., a lateral distance between neighboring pairs of memory opening fill structures 58 in a line trench 49) along the first horizontal direction hd1, and each laterally protruding portion within the two vertical stacks of laterally protruding portions of the dielectric pillar structures 24 has a second lengthwise lateral extent LLE2 along the first horizontal direction that is greater than the first lengthwise lateral extent LLE1. The configuration of FIG. 21B makes the distance LLE2 between adjacent phase change memory material portions 154 longer, which lessens a thermal disturb effect between phase change memory material portions 154.

Referring to FIGS. 22A and 22B, a third exemplary structure according to a third embodiment of the present disclosure is illustrated, which can be the same as the first exemplary structure illustrated in FIGS. 8A and 8B.

Referring to FIGS. 23A and 23B, the processing steps of FIGS. 9A and 9B can be performed on the second exemplary structure. Specifically, rectangular memory openings 25 can be formed by removing the sacrificial pillar structures 22 selective to the dielectric pillar structures 24, the insulating strips 32, and the sacrificial material strips 42. The third exemplary structure at this processing step can be the same as the first exemplary structure at the processing step of FIGS. 9A and 9B.

Referring to FIGS. 24A and 24B, the processing steps FIGS. 17A and 17B can be performed to form lateral recesses 25R by laterally recessing surface portions of the sacrificial material strips 42 around each memory opening 25. Each memory openings 25 can be laterally expanded at each level of the sacrificial material strips 42 to include two vertical stacks of lateral recesses 25R. The third exemplary structure at this processing step can be the same as the second exemplary structure at the processing steps of FIGS. 17A and 17B.

Referring to FIGS. 25A and 25B, continuous material layers can be sequentially deposited in the memory openings 25. The continuous material layers can include, for example, a continuous selector-side spacer layer 57L, a continuous selector material layer 56L, a continuous intermediate spacer layer 55L, and a continuous memory material layer 54L. The continuous selector-side spacer layer 57L can have the same material composition and the same thickness as the selector-side spacer layer 57 described above. The continuous selector material layer 56L can have the same material composition and the same thickness as the selector material layer 56 described above. The continuous intermediate spacer layer 55L can have the same material composition and the same thickness as the intermediate spacer layer 55 described above. The continuous memory material layer 54L can have the same material composition and the same thickness as the memory material layer 54 described above.

Referring to FIGS. 26A and 26B, an anisotropic etch process can be performed to remove portions of the continuous selector-side spacer layer 57L, the continuous selector material layer 56L, the continuous intermediate spacer layer 55L, and the continuous memory material layer 54L that are not masked by an overlying material portion (which can be an insulating cap strip 70 or an insulating strip 32).

The continuous selector-side spacer layer 57L is divided into a plurality of selector-side spacer layers 157 located within a respective one of the lateral recesses 25R. The continuous selector material layer 56L is divided into a plurality of selector material layers 156 located within a respective one of the lateral recesses 25R. The continuous intermediate spacer layer 55L is divided into a plurality of intermediate spacer layers 55 located within a respective one of the lateral recesses 25R. The continuous memory material layer 54L is divided into a plurality of memory material portions 154 located within a respective one of the lateral recesses 25R. Each memory material potion 154 is formed in a respective one of the lateral recesses 25R. Each unfilled volume of a memory opening 25 can have a rectangular horizontal cross-sectional shape that is invariant with translation along the vertical direction.

In one embodiment, the selector material portion 156 is clam-shaped, encloses a respective one of the memory material portions 154, and is located between a respective laterally neighboring pair of a vertical bit line 60 and a sacrificial material strip 42.

Referring to FIGS. 27A and 27B, a memory-side spacer layer 52 can be sequentially formed at a periphery of the unfilled volume of each memory opening 25. The memory-side spacer layer 52 can have the same material composition and the same thickness as in the first exemplary structure. At least one conductive material can be deposited within each remaining volume of the memory openings 25 on the inner sidewalls of the memory-side spacer layer 52 (or on the inner sidewalls of a set of material portions including a selector-side spacer layer 157, a selector material layer 156, an intermediate spacer layer 155, a memory material portion 154 in case the memory-side spacer layer 52 is omitted). Portions of the at least one conductive material and the memory-side spacer layer 52 that overlie the horizontal plane including the top surfaces of the insulating cap strips 70 can be removed by a planarization process. Each remaining portion of the at least one conductive material constitutes a vertical bit line 60.

Each contiguous combination of selector-side spacer layers 157, selector material layers 156, intermediate spacer layers 155, memory material portions 154, and a memory-side spacer layer 52 constitutes a memory film 50. The set of all material portions that fills a memory opening 25 is herein referred to as a memory opening fill structure 58, which can include a memory film 50 and a vertical bit line 60. Each memory opening fill structure 58 can have a first lateral extent LE1 along the first horizontal direction hd1. Each memory material portion 154 can have a second lateral extent LE2 along the first horizontal direction hd1 that is less than first lateral extent LE1.

Laterally alternating sequences of memory opening fill structures 58 and dielectric pillar structures 24 are formed within the line trenches 49. Each of the memory opening fill structures 58 comprises a respective vertical bit line 60. A memory material portion (such as a memory material portion 154) is formed between each laterally neighboring pair of a sacrificial material strip 42 and a vertical bit line 60. A lateral extent of an overlap between the memory material portion and a most proximal one of the sacrificial material strips 42 along the first horizontal direction hd1 (which can be the second lateral extend LE2) is less than a lateral extent of the most proximal one of the memory opening fill structures 58 along the first horizontal direction hd1 (which can be the first lateral extend LE1). A selector material portion 156 may be located between each laterally neighboring pair of a sacrificial material strip 42 and a vertical bit line 60.

Referring to FIGS. 28A-28D, the processing steps of FIGS. 11A and 11B, 12A-12C, and 13A-13F can be subsequently performed to replace each sacrificial material strip 42 within an electrically conductive strip 46 or a combination of a portion of a barrier layer 44 and an electrically conductive strip 46.

In one embodiment, the center portion of the dielectric pillar structure 24 has a first lengthwise lateral extent LLE1 (i.e., a lateral distance between neighboring pairs of memory opening fill structures 58 in a line trench 49) along the first horizontal direction hd1, and each laterally protruding portion within the two vertical stacks of laterally protruding portions of the dielectric pillar structures 24 has a second lengthwise lateral extent LLE2 along the first horizontal direction that is greater than the first lengthwise lateral extent LLE1.

Referring to all drawings and according to various embodiments of the present disclosure, a three-dimensional memory device is provided, which comprises: vertically alternating stacks of insulating strips 32 and electrically conductive strips 46 that overlie a substrate 9 and are laterally spaced apart from each other by line trenches 49 that laterally extend along a first horizontal direction hd1, and laterally alternating sequences of memory opening fill structures 58 and dielectric pillar structures 24 located within a respective one of the line trenches 49. Each memory opening fill structure 58 comprises a respective vertical bit line 60 and a memory material portion (54, 154). The memory material portion (54, 154) is located between the vertical bit line 60 and a respective electrically conductive strip 46. The insulating strips 32 and the electrically conductive strips 46 laterally extend along the first horizontal direction hd1, and the vertically alternating stacks (32, 46) are laterally spaced apart along a second horizontal direction hd2 that is perpendicular to the first horizontal direction hd1. A lateral extent of an overlap between the memory material portion(54, 154) and a most proximal one of the electrically conductive strips 46 along the first horizontal direction hd1 is less than a lateral extent along the first horizontal direction hd1 of the memory opening fill structure 58 containing the memory material portion (54, 154).

In the first embodiment illustrated in FIG. 13B, the electrically conductive strips 46 comprise serrated electrically conductive strips. Each of the serrated electrically conductive strips 46 comprises a pair of laterally undulating sidewalls, and each undulating sidewall of the electrically conductive strips 46 comprises a lateral repetition of recessed segments contacting a respective one of the dielectric pillar structures 24, and comprises laterally protruding segments contacting a respective one of the memory opening fill structures 58. Each laterally protruding segment has a lateral extend that is smaller than a lateral extent of the memory opening fill structure 58.

In one embodiment, each of the dielectric pillar structures 24 comprises: a center portion extending from the substrate 9 to a height of topmost electrically conductive strips of the vertically alternating stacks (32, 46) and contacting a respective subset of the insulating strips 32 of the vertically alternating stacks (32, 46); and two vertical stacks of laterally protruding portions (i.e., wing-shaped portions) that contact a respective subset of the recessed segments of the undulating sidewalls of the electrically conductive strips 46.

In one embodiment, each of the dielectric pillar structures 24 in the respective one of the line trenches 49 has a greater lateral extent along the second horizontal direction hd2 than each memory opening fill structure 58 in the same line trench at each level of the electrically conductive strips 46, and has a same lateral extent along the second horizontal direction hd2 as each memory opening fill structure 58 in the same line trench 49.

In one embodiment, each of the dielectric pillar structures 24 comprises four vertically-extending convex surfaces at each level of the electrically conductive strips 46.

In one embodiment, each recessed segment of the electrically conductive strips 46 is adjoined to a respective one of the protruding segments of the electrically conductive strips 46 via a concave sidewall of a respective one of the electrically conductive strips 46.

In one embodiment, the memory material portions (54, 154) comprise phase change memory material portions, and the electrically conductive strips 46 comprise word lines.

In one embodiment, each of the memory opening fill structures 58 comprises a selector material layer 56 that laterally surrounds the vertical bit line 60.

Figure 21B:
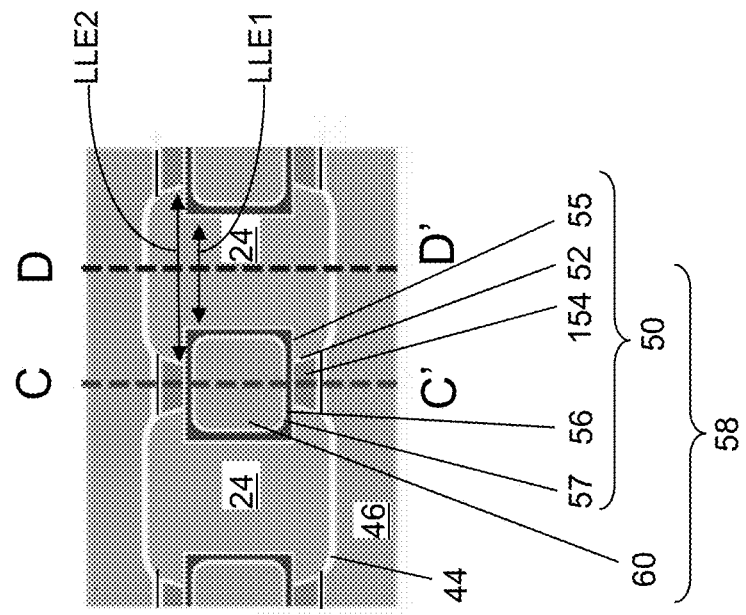
FIG. 21B is a second first horizontal cross-sectional view of a region of the second exemplary structure after replacement of sacrificial material strips with electrically conductive strips according to an embodiment of the present disclosure.
Figure 21A:
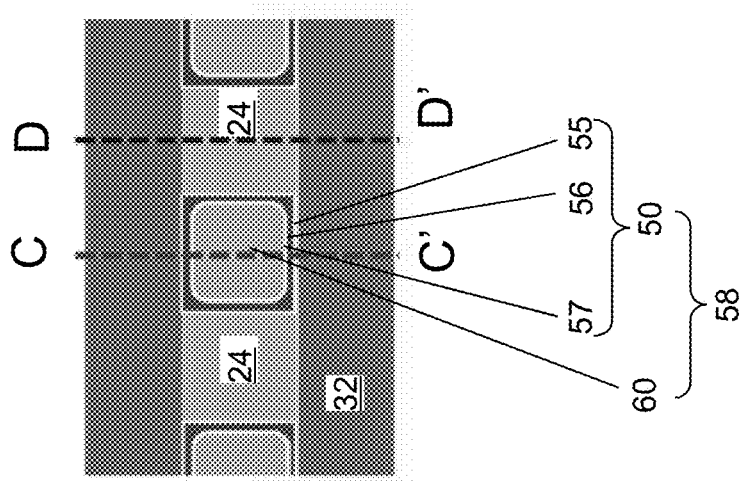
FIG. 21A is a first horizontal cross-sectional view of a region of the second exemplary structure after replacement of sacrificial material strips with electrically conductive strips according to an embodiment of the present disclosure.
Figure 21D:
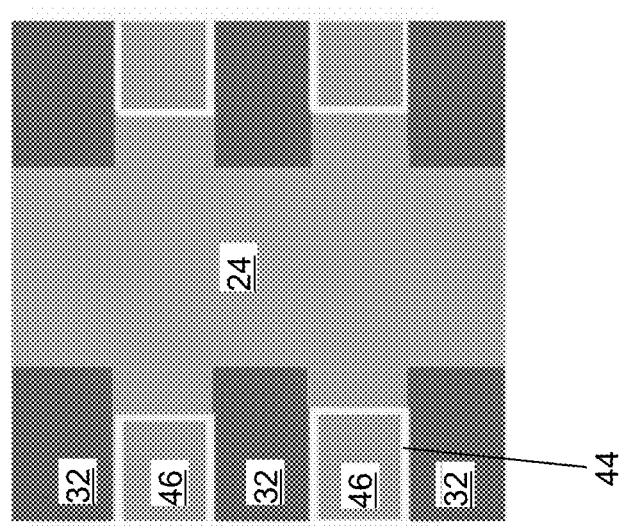
FIG. 21D is a vertical cross-sectional view of the first exemplary structure along the vertical plane D-D' of FIGS. 21A and 21B.
Figure 21C:
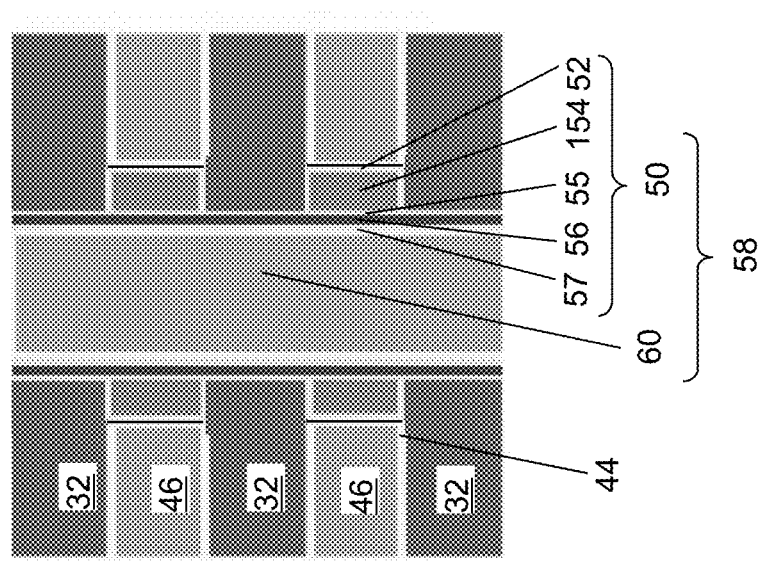
FIG. 21C is a vertical cross-sectional view of the first exemplary structure along the vertical plane C-C' of FIGS. 21A and 21B.
Figure 28D:
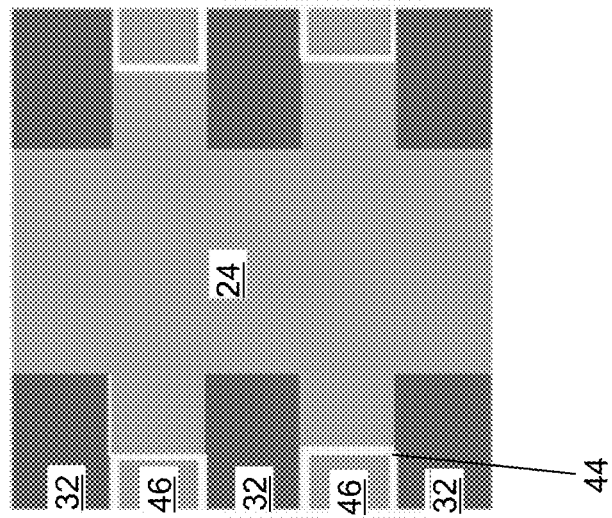
FIG. 28D is a vertical cross-sectional view of the first exemplary structure along the vertical plane D-D' of FIGS. 28A and 28B.
Figure 28C:
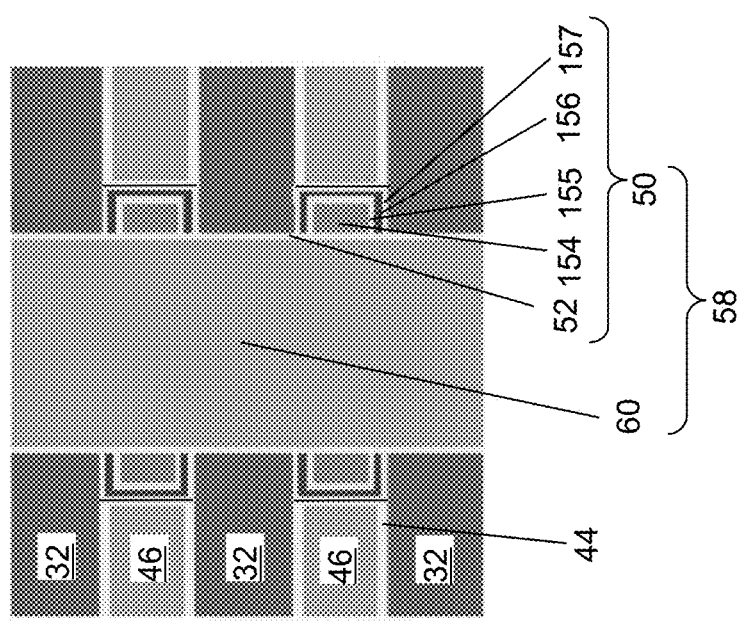
FIG. 28C is a vertical cross-sectional view of the first exemplary structure along the vertical plane C-C' of FIGS. 28A and 28B.

Referring to FIGS. 21B and 28B of the second and third embodiments of the present disclosure, the vertical bit line 60 in a respective one of the memory opening fill structures 58 has a pair of first straight sidewalls extending along the first horizontal direction hd1 and a pair of second straight sidewalls extending along the second horizontal direction hd2 (i.e., having a rectangular horizontal cross-sectional shape); and a lateral extent of each vertical bit line 60 along the first horizontal direction hd1 is greater than a lateral extent of any one of the memory material portions 154 in the same memory opening fill structure 58.

In one embodiment, each of the memory material portions 154 in a respective one of the memory fill opening structures 58 has a trapezoidal horizontal cross-sectional profile in which a width (measured along the first horizontal direction hd1) of a respective memory material portion 154 decreases with a lateral distance from a most proximal one of the electrically conductive strips 46 toward a most proximal one of the vertical bit lines 60 in the same memory opening fill structure 58.

In one embodiment, each of the memory opening fill structures 58 further comprises a memory-side spacer layer 52 that laterally surrounds a respective vertical bit line 60.

In one embodiment, each of the memory opening fill structures 58 further comprises a selector material portion (which may be a discrete selector material portion 156 or a portion of a selector material layer 56) is disposed between each laterally neighboring pair of the memory material portion 154 and the vertical bit line 60.

In one embodiment, the selector material portion comprises a portion of a selector material layer 56 provided within a respective one of the memory opening fill structures 58.

In one embodiment, the selector material portion 156 is clam-shaped, encloses a respective one of the memory material portions 154, and is located between a respective laterally neighboring pair of a vertical bit line 60 and an electrically conductive strip 46.

The lateral extent of each region in which an outer surface of a memory material potion (54, 154) has an areal overlap (as measured in a vertical plane) with a most proximal sidewall surface of the electrically conductive strips 46 is less than the maximum lateral extent of a vertical bit line 60 adjacent to the memory material portion (54, 154). By reducing the overlap area between neighboring pairs of a memory material potion and an electrically conductive strip (i.e., word line) 46, the reset current density in a phase change memory material is increased. This causes more intense Joule heating and more rapidly elevates temperature of a phase change memory material near the overlap area with an electrically conductive layer 46. The transition from a low resistive crystalline phase to a high resistive amorphous phase occurs faster due the thermal energy, and enables the device operation quicker. The local current density increase only in the phase change memory material may also reduce the supply voltage for the memory device chip. This reduces the device power consumption and reduces the required size of the driver transistor(s). Furthermore, this also makes the distance between adjacent phase change memory material portions, which lessens the thermal disturb effect between the adjacent phase change memory material portions.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
vertically alternating stacks of insulating strips and electrically conductive strips that overlie a substrate and are laterally spaced from each other by line trenches that laterally extend along a first horizontal direction; and
laterally alternating sequences of memory opening fill structures and dielectric pillar structures located within a respective one of the line trenches, each memory opening fill structure comprising a respective vertical bit line and a memory material portion, wherein the memory material portion is located between the vertical bit line and a respective electrically conductive strip;
wherein:
the insulating strips and the electrically conductive strips laterally extend along the first horizontal direction;
the vertically alternating stacks are laterally spaced apart along a second horizontal direction that is perpendicular to the first horizonal direction; and
a lateral extent of an overlap between the memory material portion and a most proximal one of the electrically conductive strips along the first horizontal direction is less than a lateral extent along the first horizontal direction of the memory opening fill structure containing the memory material portion.

2. The three-dimensional memory device of claim 1, wherein:
the electrically conductive strips comprise serrated electrically conductive strips;
each of the serrated electrically conductive strips comprises a pair of laterally undulating sidewalls;
each undulating sidewall of the electrically conductive strips comprises a lateral repetition of recessed segments contacting a respective one of the dielectric pillar structures, and laterally protruding segments contacting a respective one of the memory opening fill structures; and
each laterally protruding segment has a lateral extend that is smaller than a lateral extent of the memory opening fill structure.

3. The three-dimensional memory device of claim 2, wherein each of the dielectric pillar structures comprises:
a center portion extending from the substrate to a height of topmost electrically conductive strips of the vertically alternating stacks and contacting a respective subset of the insulating strips of the vertically alternating stacks; and
two vertical stacks of laterally protruding portions that contact a respective subset of the recessed segments of the undulating sidewalls of the electrically conductive strips.

4. The three-dimensional memory device of claim 3, wherein:
the center portion has a first lengthwise lateral extent along the first horizontal direction; and
each laterally protruding portion within the two vertical stacks of laterally protruding portions has a second lengthwise lateral extent along the first horizontal direction that is greater than the first lengthwise lateral extent.

5. The three-dimensional memory device of claim 4, wherein each of the dielectric pillar structures in the respective one of the line trenches has a greater lateral extent along the second horizontal direction than each memory opening fill structure in the same line trench at each level of the electrically conductive strips, and has a same lateral extent along the second horizontal direction as each memory opening fill structure in the same line trench.

6. The three-dimensional memory device of claim 5, wherein each of the dielectric pillar structures comprises four vertically-extending convex surfaces at each level of the electrically conductive strips.

7. The three-dimensional memory device of claim 3, wherein each recessed segment of the electrically conductive strips is adjoined to a respective one of the protruding segments of the electrically conductive strips via a concave sidewall of a respective one of the electrically conductive strips.

8. The three-dimensional memory device of claim 1, wherein the memory material portion comprises a phase change memory material portion, and wherein the electrically conductive strips comprise word lines.

9. The three-dimensional memory device of claim 8, wherein each of the memory opening fill structures further comprises a selector material layer that laterally surrounds the vertical bit line.

10. The three-dimensional memory device of claim 1, wherein:
the vertical bit line in a respective one of the memory opening fill structures has a pair of first straight sidewalls extending along the first horizontal direction and a pair of second straight sidewalls extending along the second horizontal direction; and
a lateral extent of each vertical bit line along the first horizontal direction is greater than a lateral extent of any one of the memory material portions in the same memory opening fill structure.

11. The three-dimensional memory device of claim 10, wherein each of the memory material portions in a respective one of the memory opening fill structures has a trapezoidal horizontal cross-sectional profile in which a width of a respective memory material portion decreases with a lateral distance from a most proximal one of the electrically conductive strips toward the vertical bit line in the same memory opening fill structure.

12. The three-dimensional memory device of claim 11, wherein each of the memory opening fill structures further comprises a memory-side spacer layer that laterally surrounds the vertical bit line.

13. The three-dimensional memory device of claim 11, each of the memory opening fill structures further comprises a selector material portion disposed between each laterally neighboring pair of the memory material portion and the vertical bit line.

14. The three-dimensional memory device of claim 13, wherein the selector material portion comprises a portion of a selector material layer provided within a respective one of the memory opening fill structures.

15. The three-dimensional memory device of claim 13, wherein the selector material portion encloses a respective one of the memory material portions.

16. A method of forming a three-dimensional memory device, comprising:
forming a vertically alternating sequence of insulating layers and sacrificial material layers over a substrate;
forming line trenches extending along a first horizontal direction through the vertically alternating sequence, wherein the vertically alternating sequence is divided into vertically alternating stacks of insulating strips and sacrificial material strips that are laterally spaced apart along a second horizontal direction;
forming laterally alternating sequences of memory opening fill structures and dielectric pillar structures within the line trenches, wherein each of the memory opening fill structures comprises a vertical bit line and a memory material portion located between each laterally neighboring pair of a sacrificial material strip and the vertical bit line, wherein a lateral extent of an overlap between the memory material portion and a most proximal one of the sacrificial material strips along the first horizontal direction is less than a lateral extent along the first horizontal direction of the memory opening fill structure containing the memory material portion; and replacing the sacrificial material strips with electrically conductive strips.

17. The method of claim 16, further comprising:

forming a row of sacrificial pillar structures and via cavities in each of the line trenches;

forming the dielectric pillar structures in the via cavities, wherein laterally alternating sequences of sacrificial pillar structures and dielectric pillar structures are formed within the line trenches; and replacing the sacrificial pillar structures with the memory opening fill structures.

18. The method of claim 17, further comprising:

forming rectangular memory openings by removing the sacrificial pillar structures selective to the dielectric pillar structures, the insulating strips, and the sacrificial material strips; and forming lateral recesses by laterally recessing surface portions of the sacrificial material strips selective to the insulating strips and the dielectric pillar structures, wherein the memory material portions are formed in the lateral recesses.

19. The method of claim 18, further comprising forming a selector material portion between each laterally neighboring pair of the sacrificial material strip and the vertical bit line.

20. The method of claim 18, wherein:

the electrically conductive strips comprise word lines;

each memory material portion is formed as a phase change memory material layer within a respective one of the rectangular memory openings; and each vertical bit line is formed on a respective one of the memory material layers.

* * * * *